(12) United States Patent
Son et al.

(10) Patent No.: US 12,094,904 B2
(45) Date of Patent: Sep. 17, 2024

(54) IMAGE SENSOR

(71) Applicant: SAMSUNG ELECTRONICS CO., LTD., Suwon-si (KR)

(72) Inventors: Kyoungmok Son, Suwon-si (KR); Hyejung Kim, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 133 days.

(21) Appl. No.: 17/342,254

(22) Filed: Jun. 8, 2021

(65) Prior Publication Data

US 2022/0109013 A1    Apr. 7, 2022

(30) Foreign Application Priority Data

Oct. 6, 2020   (KR) .................. 10-2020-0128954

(51) Int. Cl.
*H01L 27/146*   (2006.01)

(52) U.S. Cl.
CPC .... *H01L 27/1463* (2013.01); *H01L 27/14621* (2013.01); *H01L 27/14627* (2013.01); *H01L 27/14636* (2013.01); *H01L 27/14645* (2013.01); *H01L 27/14689* (2013.01)

(58) Field of Classification Search
CPC .................................................. H01L 27/1463
See application file for complete search history.

(56) References Cited

U.S. PATENT DOCUMENTS

| | | | |
|---|---|---|---|
| 6,335,231 B1 | 1/2002 | Yamazaki et al. | |
| 6,380,037 B1 | 4/2002 | Osanai | |
| 6,803,284 B2 | 10/2004 | Yamazaki et al. | |
| 6,888,750 B2 | 5/2005 | Walker et al. | |
| 7,473,971 B2 | 1/2009 | Yamazaki et al. | |
| 7,476,576 B2 | 1/2009 | Yamazaki et al. | |
| 7,560,330 B2 | 7/2009 | Hwang | |
| 7,796,969 B2 | 9/2010 | Kelly et al. | |
| 7,890,891 B2 | 2/2011 | Stuber et al. | |
| 8,043,927 B2 | 10/2011 | Park et al. | |
| 8,954,902 B2 | 2/2015 | Stuber et al. | |
| 9,276,026 B1 | 3/2016 | Chung et al. | |
| 9,670,494 B2 | 2/2017 | Jerome et al. | |
| 2011/0241152 A1 | 10/2011 | Hsiao et al. | |
| 2014/0054662 A1* | 2/2014 | Yanagita | H01L 27/1462 438/73 |
| 2018/0151759 A1* | 5/2018 | Huang | H10K 39/32 |

(Continued)

FOREIGN PATENT DOCUMENTS

| | | |
|---|---|---|
| EP | 1598452 | 10/2015 |
| JP | 2008-130795 | 6/2008 |

(Continued)

*Primary Examiner* — Yara B Green
*Assistant Examiner* — Fakeha Sehar
(74) *Attorney, Agent, or Firm* — F. CHAU & ASSOCIATES, LLC

(57) ABSTRACT

An image sensor includes: on a substrate that includes a first surface and a second surface opposite to the first surface, photoelectric conversion regions located in the substrate, the photoelectric conversion regions being separated from each other; partition layers spaced apart from the first surface and between the photoelectric conversion regions; and pixel separation layers on the partition layers that separate the photoelectric conversion regions from each other.

20 Claims, 22 Drawing Sheets

(56) References Cited

U.S. PATENT DOCUMENTS

| | | | |
|---|---|---|---|
| 2019/0131327 A1* | 5/2019 | Chou | H01L 27/1464 |
| 2019/0386049 A1* | 12/2019 | Jung | H01L 27/1463 |
| 2022/0302185 A1* | 9/2022 | Honda | H01L 27/14689 |

FOREIGN PATENT DOCUMENTS

| | | |
|---|---|---|
| JP | 6182556 | 8/2017 |
| JP | 3325538 | 9/2020 |
| KR | 10-0776151 | 11/2007 |
| KR | 10-0778856 | 11/2007 |
| KR | 10-2009-0088044 | 8/2009 |
| KR | 10-2010-0000161 | 1/2010 |

* cited by examiner

IMAGE SENSOR

CROSS-REFERENCE TO RELATED APPLICATION

This application claims priority under 35 U.S.C. § 119 from Korean Patent Application No. 10-2020-0128954, filed on Oct. 6, 2020 in the Korean Intellectual Property Office, the contents of which are herein incorporated by reference in their entirety.

BACKGROUND

Technical Field

The inventive concept relates to an image sensor, and more particularly, to an image sensor capable of obtaining a clear image by reducing noise.

Discussion of the Related Art

An image sensor that captures an image and converts the captured image into electrical signals can be used not only in electronic devices for general consumers, such as digital cameras, portable phone cameras, or portable camcorders, but also in cameras mounted in vehicles, security devices, or robots.

Because image sensors have been miniaturized, pixel sizes have also been reduced. Along with a decrease in a pixel size of an image sensor, noise has increased, which makes it challenging to obtain a clear image. In particular, in the case of noisy low luminance images, it is very challenging for an image sensor to obtain a clear image.

SUMMARY

Embodiments of the inventive concept provide an image sensor that can obtain clear images by reducing noise.

According to an embodiment of the inventive concept, there is provided an image sensor that includes: a substrate that includes a first surface and a second surface opposite to the first surface, photoelectric conversion regions located in the substrate, the photoelectric conversion regions being separated from each other; partition layers spaced apart from the first surface and between the photoelectric conversion regions; and pixel separation layers located on the partition layers that separate the photoelectric conversion regions from each other.

According to another embodiment of the inventive concept, there is provided an image sensor that includes: a substrate that includes a first surface and a second surface opposite to the first surface; and unit pixels located in the substrate between the first surface and the second surface and that are separated from each other. Each of the unit pixels includes: a photoelectric conversion region located in the substrate; partition layers located at both sides of the photoelectric conversion region and separated from the first surface; and pixel separation layers located on the partition layers and that are separated from both side surfaces of the photoelectric conversion region.

According to another embodiment of the inventive concept, there is provided an image sensor that includes: a substrate that includes a lower surface and an upper surface opposite to the lower surface, photoelectric conversion regions located in the substrate and that are separated from each other; partition layers located closer to the lower surface than the upper surface and at both sides of the photoelectric conversion regions; pixel separation layers located in the substrate that separate the photoelectric conversion regions from each other by penetrating the substrate from the lower surface to the upper surface between the photoelectric conversion regions on the partition layers; color filter layers located on the lower surface that correspond to the photoelectric conversion regions; a lens layer located on the color filter layers; and a transistor and a multi-layer wiring structure located on the upper surface.

DETAILED DESCRIPTION

Hereinafter, embodiments of the inventive concept will be described in detail with reference to the accompanying drawings.

In the specification, the drawings may be exaggerated to more clearly illustrate an embodiment of the inventive concept.

Figure 1:
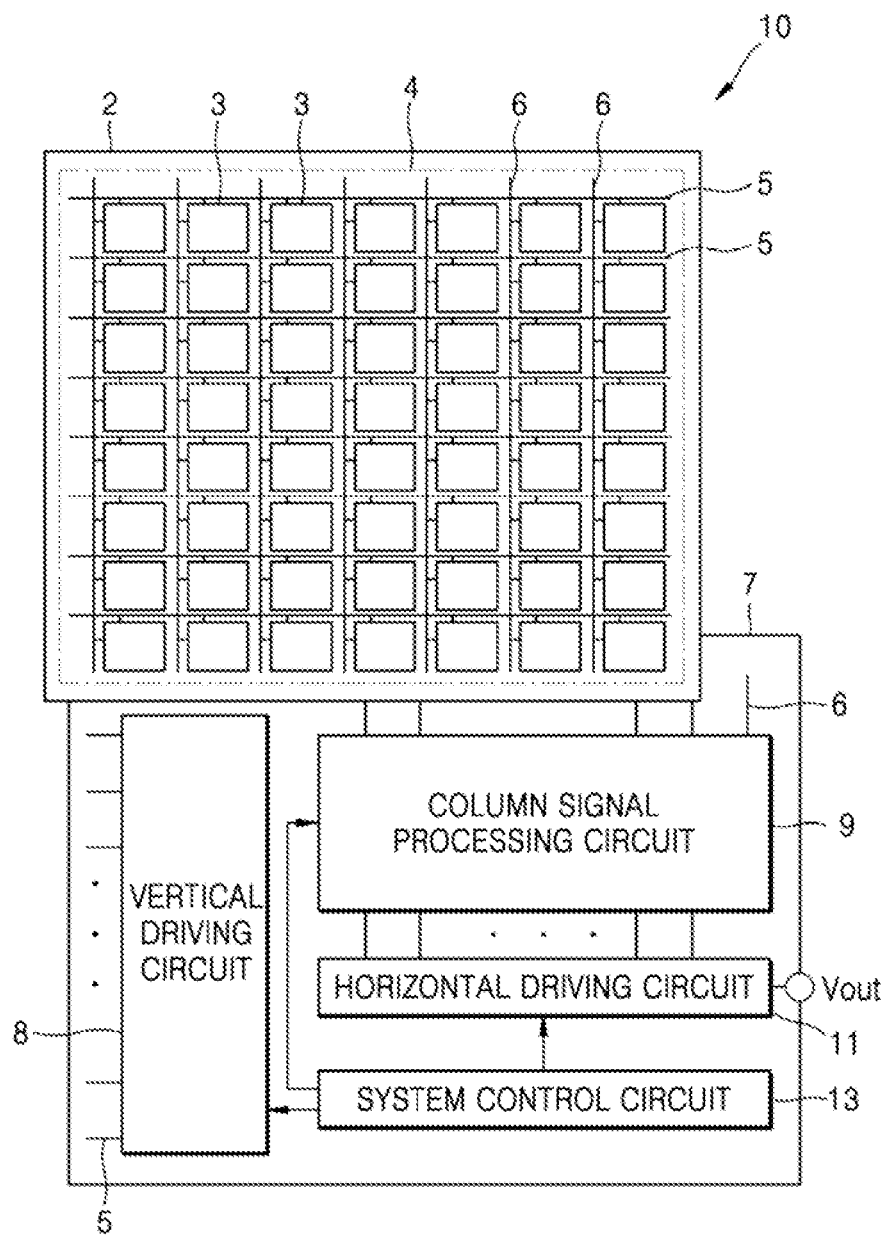
FIG. 1 is a block diagram of an image sensor according to an embodiment of the inventive concept.

FIG. 1 is a block diagram of an image sensor 10 according to an embodiment of the inventive concept.

In particular, according to an embodiment, the image sensor 10 is a stacked image sensor that includes a first substrate 2 and a second substrate 7. The image sensor 10 is a complementary metal oxide semiconductor (CMOS)

image sensor. The technical ideas of the inventive concept to be described below apply to the first substrate 2.

According to an embodiment, the image sensor 10 is formed by stacking and bonding the first substrate 2 onto the second substrate 7. The first substrate 2 is a sensor substrate that includes a pixel circuit. The second substrate 7 is a support substrate that supports the first substrate 2 and that has a logic circuit that drives the pixel circuit. The first substrate 2 is electrically connected to the second substrate 7.

In more detail, according to an embodiment, the first substrate 2 has a pixel array region 4 in which unit pixels 3, each including a photoelectric conversion region, are regularly and two-dimensionally arranged. In the pixel array region 4, pixel driving lines 5 are laid in a row direction, vertical signal lines 6 are laid in a column direction, and each unit pixel 3 is connected to one pixel driving line 5 and one vertical signal line 6.

According to an embodiment, each unit pixel 3 includes a pixel circuit that includes a photoelectric converter or a photoelectric conversion region, a charge accumulator or a floating diffusion region, a transistor, e.g., a MOS transistor, a capacitive element, etc.

According to an embodiment, the second substrate 7 includes a logic circuit that drives each unit pixel 3 in the first substrate 2 and includes a vertical driving circuit 8, a column signal processing circuit 9, a horizontal driving circuit 11, a system control circuit 13, etc. The image sensor 10 outputs an output voltage Vout through the horizontal driving circuit 11.

Figure 2:
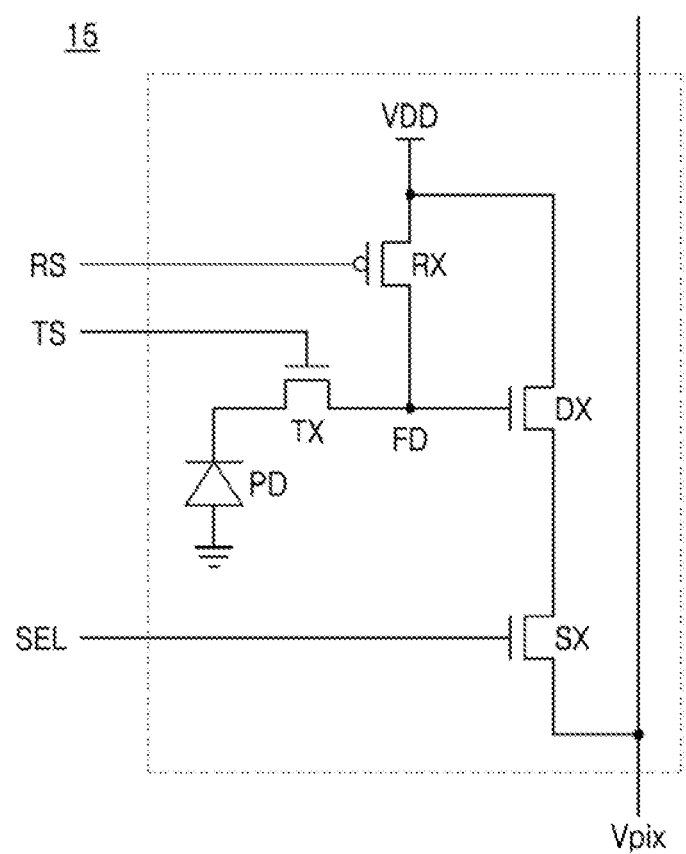
FIG. 2 is a circuit diagram of a pixel in an image sensor, according to an embodiment of the inventive concept.

FIG. 2 is a circuit diagram of a pixel circuit 15 in an image sensor, according to an embodiment of the inventive concept.

In particular, according to an embodiment, the pixel circuit 15 in each of the unit pixels 3 of FIG. 1 includes transistors RX, DX, SX, and TX. The transistors RX, DX, SX, and TX include a reset transistor RX, a drive transistor DX, a transmit transistor TX, and a select transistor SX. Charges generated in a photoelectric conversion region, such as a photodiode PD, are transmitted to a floating diffusion region FD by the transmit transistor TX and accumulated in the floating diffusion region FD. The transmit transistor TX operates in response to a transmission control signal TS transmitted to a gate of the transmit transistor TX.

According to an embodiment, the drive transistor DX operates as a source follower buffer amplifier by the charges accumulated in the floating diffusion region FD. The drive transistor DX amplifies the charges accumulated in the floating diffusion region FD and transmitted the amplified charges to the select transistor SX.

According to an embodiment, the select transistor SX operates in response to a selection control signal SEL that selects a certain unit pixel from the pixel array and performs a switching and addressing operation. When the selection control signal SEL is received by the select transistor SX, the select transistor SX outputs an electric signal Vpix to a column line connected to a corresponding unit pixel.

According to an embodiment, the reset transistor RX operates in response to a reset control signal RS. Upon receiving the reset control signal RS, the reset transistor RX resets a voltage of the floating diffusion region FD to that of a power supply voltage VDD.

Figure 3A:
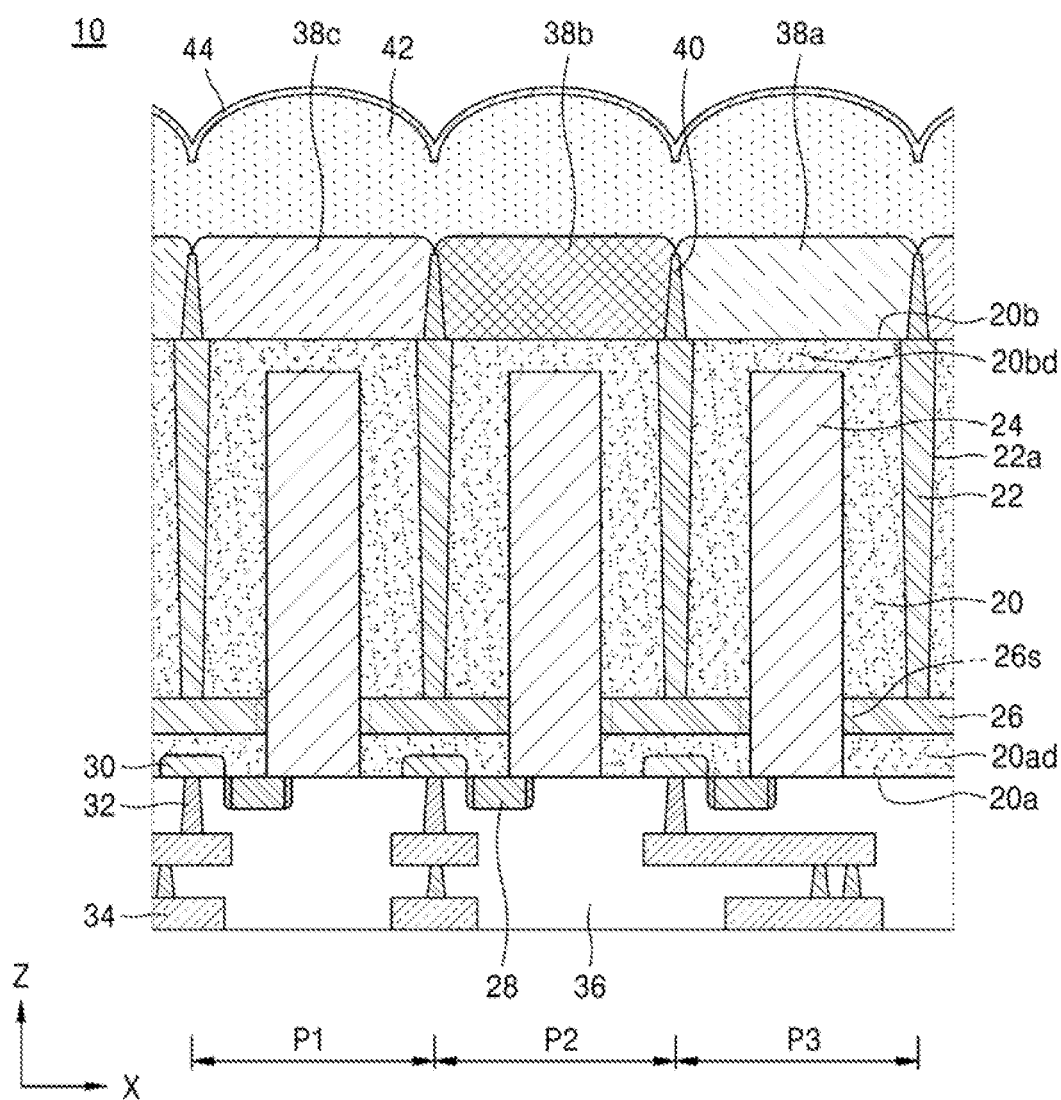
FIG. 3A is a cross-sectional view of an image sensor according to an embodiment of the inventive concept.
Figure 3B:
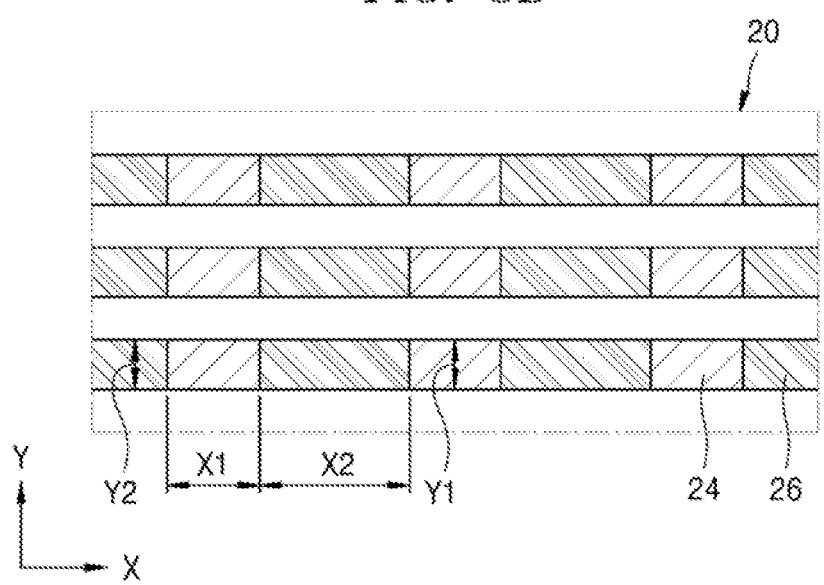
FIG. 3B is a top layout diagram of partition layers and photoelectric conversion regions of FIG. 3A.
Figure 3C:
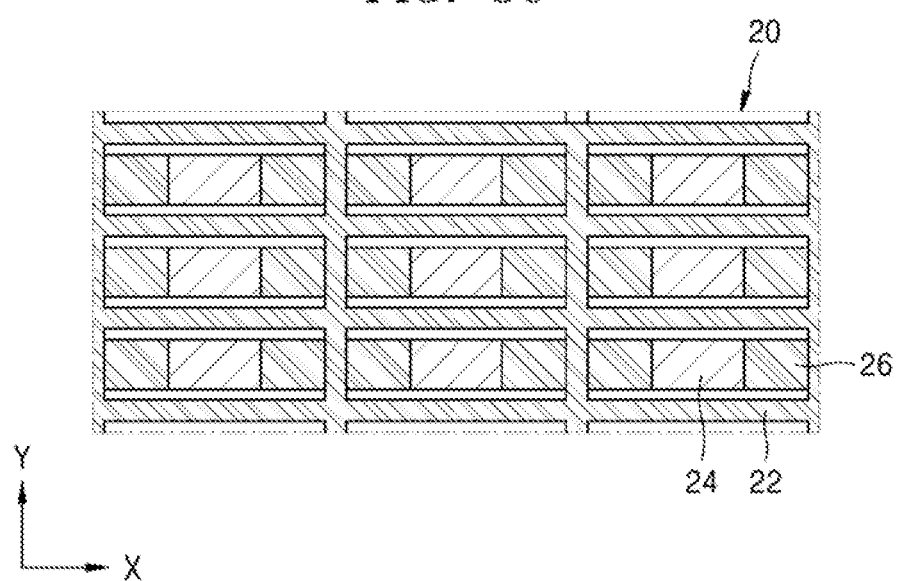
FIG. 3C is a top layout diagram of the partition layers, the photoelectric conversion regions and pixel separation layers of FIG. 3A.

FIG. 3A is a cross-sectional view of the image sensor 10 according to an embodiment of the inventive concept, FIG. 3B is a top layout diagram of partition layers and photoelectric conversion regions of FIG. 3A, and FIG. 3C is a top layout diagram of the partition layers, the photoelectric conversion regions and pixel separation layers of FIG. 3A;

In particular, according to an embodiment, the image sensor 10 includes a substrate 20, pixel separation layers 22, photoelectric conversion regions 24, and partition layers 26. The substrate 20 includes a first surface 20a and a second surface 20b that is opposite to the first surface 20a. The first surface 20a is an upper surface or a front surface of the substrate 20. The second surface 20b is a lower surface or a back surface of the substrate 20.

According to an embodiment, the photoelectric conversion regions 24 are located in the substrate 20. The photoelectric conversion regions 24 are separated from each other in the substrate 20. The photoelectric conversion regions 24 are photodiode regions. The photoelectric conversion regions 24 may include a P-type impurity region or an N-type impurity region. The photoelectric conversion regions 24 are separated from each other in an X direction and a Y direction as shown in FIG. 3B. Each of the photoelectric conversion regions 24 has a width X1 and a length Y1.

According to an embodiment, the partition layers 26 are spaced apart from the first surface 20a and are located between the photoelectric conversion regions 24 as shown in FIG. 3A. The partition layers 26 may be referred to as barrier layers. The partition layers 26 are buried in the substrate 20.

In some embodiments, the partition layers 26 are total reflection layers from which incident light is totally reflected. The partition layers 26 are silicon oxide layers. In some embodiments, the partition layers 26 are silicon oxide layers formed by separation by an implanted oxide (SI-MOX) process.

According to an embodiment, the partition layers 26 come in contact with both side surfaces of the photoelectric conversion regions 24. According to other embodiments, the partition layers 26 are separated or spaced apart from the photoelectric conversion regions 24 at both side surfaces of the photoelectric conversion regions 24 by separations regions 26s.

According to an embodiment, the partition layers 26 are separated from each other in the X direction and the Y direction as shown in FIG. 3B. Each of the partition layers 26 has a width X2 and a length Y2. The width X2 and the length Y2 of each of the partition layers 26 can be adjusted to determine the width X1 and the length Y1 of each of the photoelectric conversion regions 24. The width X1 and the length Y1 of each of the photoelectric conversion regions 24 can be adjusted to determine the width X2 and the length Y2 of each of the partition layers 26.

According to an embodiment, the pixel separation layers 22 are respectively located on the partition layers 26 to separate the photoelectric conversion regions 24 from each other. The pixel separation layers 22 are in contact with lower surfaces of the partition layers 26. The pixel separation layers 22 are connected to the partition layers 26, respectively.

According to an embodiment, the pixel separation layers 22 include material layers buried in trenches 22a formed in the substrate and that extend in a direction from the second surface, i.e., the lower surface or the back surface, 20b to the first surface, i.e., the upper surface or the front surface, 20a. The pixel separation layers 22 are aligned with the partition layers 26. The trenches 22a may be referred to as deep trenches.

In some embodiments, the pixel separation layers 22 have a tapered shape whose width decreases in a horizontal X direction as the pixel separation layers 22 extend from the second surface 20b to the first surface 20a. In some embodiments, the pixel separation layers 22 include a metal oxide such as a hafnium oxide, an aluminum oxide, or a tantalum oxide. In some embodiments, the pixel separation layers 22 include an insulating material such as a silicon oxide, a silicon nitride, or a silicon oxynitride.

According to an embodiment, the pixel separation layers 22 are arranged around the photoelectric conversion regions 24 as shown in FIG. 3C. As shown in FIGS. 3A and 3C, the pixel separation layers 22 and the partition layers 26 surround the photoelectric conversion regions 24 at parts of the photoelectric conversion regions 24 that are closer to the first surface than to the second surface.

According to an embodiment, the image sensor 10 includes a first substrate body layer 20ad under the partition layers 26. The first substrate body layer 20ad is a part of the substrate 20. The first substrate body layer 20ad is a contact region in contact with a ground electrode. The image sensor 10 includes an second substrate body layer 20bd on the photoelectric conversion regions 24. The second substrate body layer 20bd is a part of the substrate 20.

According to an embodiment, a transistor 28 and 30 is located on the first surface 20a of the substrate 20. Although the transistor 28 and 30 is shown as being a planar transistor, the transistor 28 and 30 may also be a vertical transistor. The transistor 28 and 30 is the transmit transistor TX in the pixel circuit 15 of FIG. 2. The transmit transistor TX includes a gate 28 and a floating diffusion region 30. For convenience of illustration, FIG. 3A shows only the transmit transistor TX. A multi-layer wiring structure 32, 34, and 36 is located on the transistor 28 and 30 on the first surface 20a.

According to an embodiment, the multi-layer wiring structure 32, 34, and 36 includes a via wiring layer 32 connected to the floating diffusion region 30, a multi-layer wiring layer 34 connected to the via wiring layer 32, and an interlayer insulating layer 36 that insulates the via wiring layer 32 from the multi-layer wiring layer 34. The via wiring layer 32 connects the multi-layer wiring layers 34 to each other.

According to an embodiment, color filter layers 38a, 38b, and 38c are located on the second surface 20b. In some embodiments, the color filter layers 38a, 38b, and 38c include a red color filter layer 38a, a blue color filter layer 38b, and a green color filter layer 38c. Grid layers 40 are located between the color filter layers 38a, 38b, and 38c. A lens layer 42 is located on the color filter layers 38a, 38b, and 38c and the grid layers 40, and a lens protection layer 44 is located on the lens layer 42.

According to an embodiment, the image sensor 10 includes three unit pixels P1, P2, and P3 as shown in FIG. 3A. In some embodiments, the three unit pixels P1, P2, and P3 of the image sensor 10 respectively correspond to the color filter layers 38a, 38b, and 38c. Each of the unit pixels P1, P2, and P3 corresponds to the unit pixel 3 of FIG. 1.

In some embodiments, the image sensor 10 includes the three unit pixels P1, P2, and P3, and each unit pixel includes the photoelectric conversion regions 24, the pixel separation layers 22, and the partition layers 26. In some embodiments, each of the unit pixels P1, P2, and P3 includes one photoelectric conversion region 24, and portions of the pixel separation layers 22 and portions of the partition layers 26 located at both sides of the photoelectric conversion region 24.

In some embodiments, the image sensor 10 as described above is a back illuminated image sensor in which incident light is incident to the second surface 20b, i.e., the back surface, of the substrate 20. The image sensor 10 includes the partition layers 26 to reduce cross talk, such as optical cross talk, between the unit pixels P1, P2, and P3, which occurs due to obliquely incident light, i.e., inclined light, as described below.

In some embodiments, the image sensor 10 reduces cross talk between the unit pixels P1, P2, and P3, thereby suppressing noise. Accordingly, the image sensor 10 according to embodiments of the inventive concept can obtain a clear image.

Figure 4:
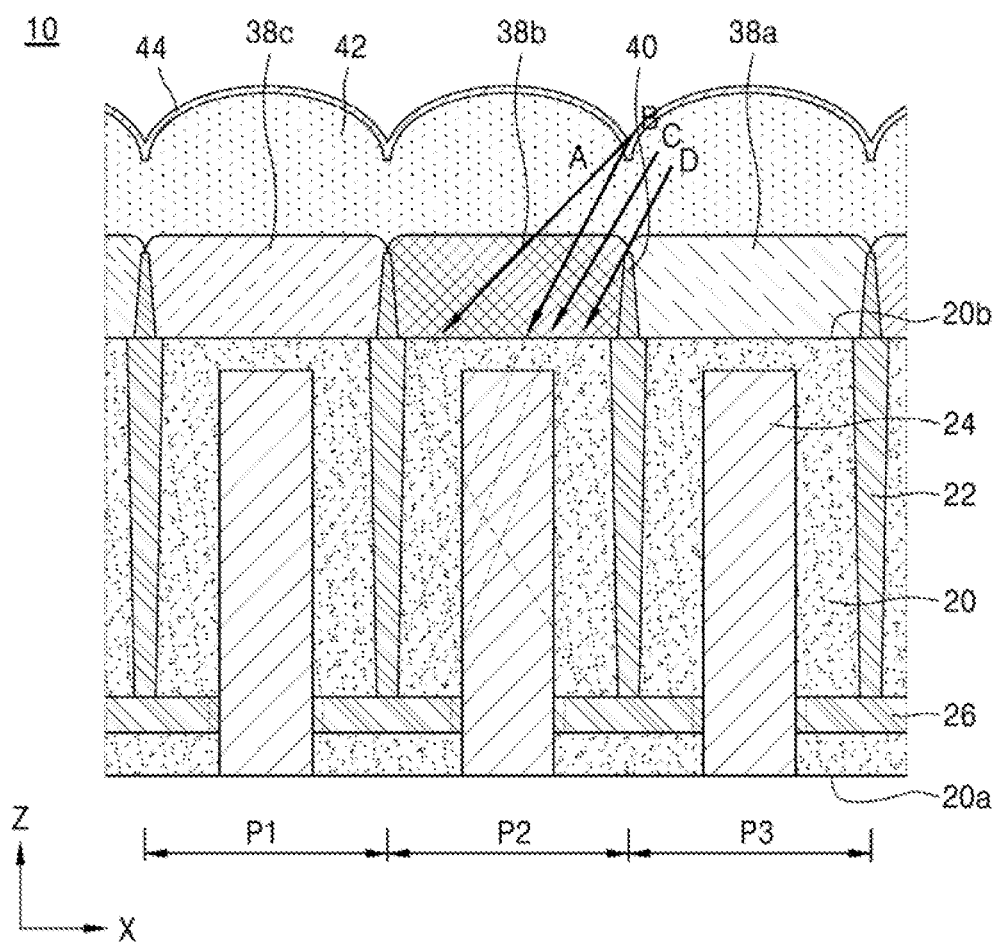
FIG. 4 is a cross-sectional view that illustrates a path of incident light in an image sensor, according to an embodiment of the inventive concept.
Figure 5:
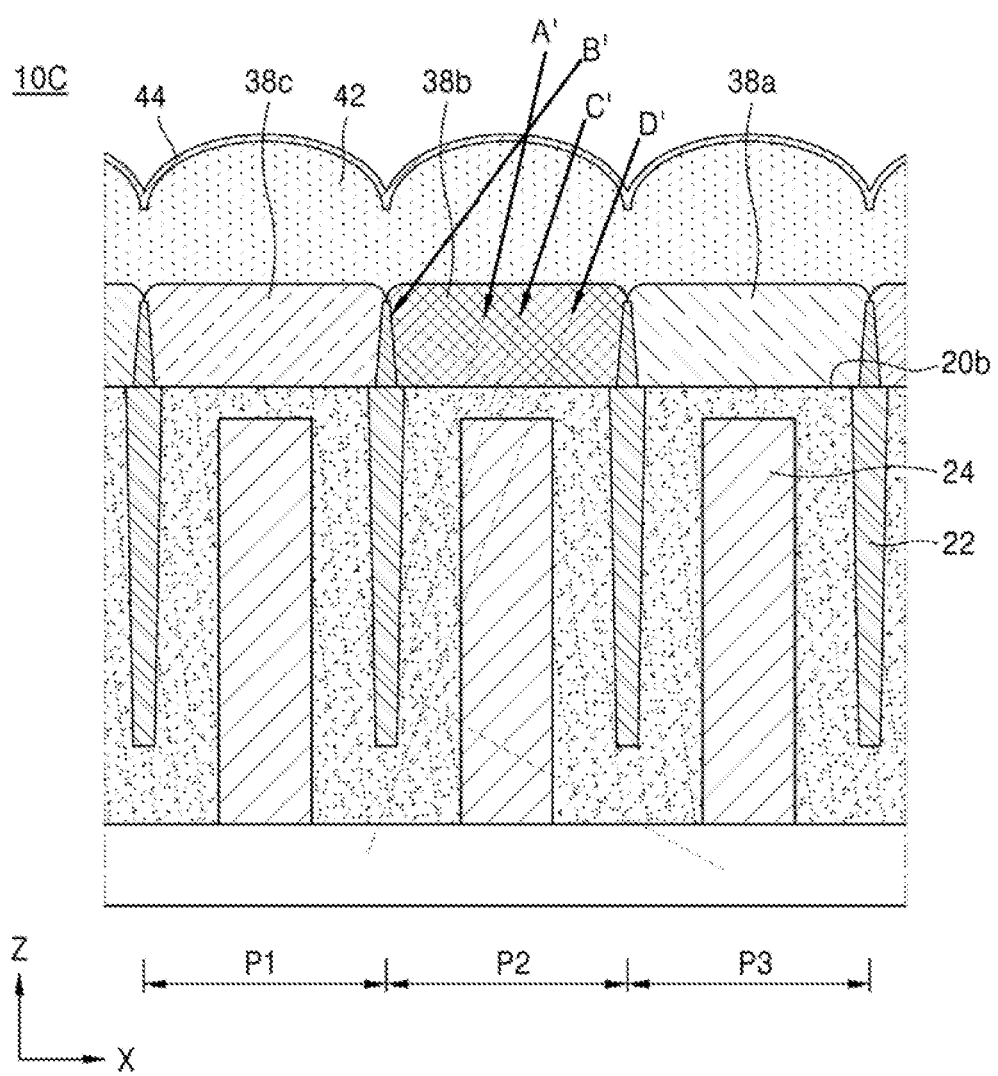
FIG. 5 is a cross-sectional view that illustrates a path of incident light in an image sensor to be compared to an image sensor of FIG. 4

FIG. 4 is a cross-sectional view that illustrates a path of incident light in the image sensor 10, according to the inventive concept, and FIG. 5 is a cross-sectional view that illustrates a path of incident light in an image sensor 10C to be compared to the image sensor 10 of FIG. 4.

In particular, for convenience of illustration, the multi-layer wiring structure 32, 34, and 36 of FIG. 3A are not shown in the image sensor 10 of FIG. 4, and the image sensor 10C of FIG. 5 is provided for comparison with the image sensor 10 of FIG. 4. In FIGS. 4 and 5, like reference numerals denote like members.

In the image sensor 10 of FIG. 4, in some embodiments, incident light A, B, C, and D is obliquely incident to the unit pixel P2 through the lens layer 42 and the color filter layer 38b. The incident light A, B, C, and D is obliquely inclined to the unit pixel P2.

In the image sensor 10 of FIG. 4, in some embodiments, the light A, B, C, and D obliquely incident to the unit pixel P2 is blocked by the partition layers 26 from influencing the adjacent unit pixels P1 and P3. Accordingly, the image sensor 10 of FIG. 4 suppresses noise by reducing cross talk between the unit pixels P1, P2, and P3.

In the comparative image sensor 10C of FIG. 5, light A', B', C', and D' is obliquely incident to the unit pixel P2 through the lens layer 42 and the color filter layer 38b. The incident light A', B', C', and D' is obliquely inclined to the unit pixel P2.

In the image sensor 10C of FIG. 5, some incident light C' and D' of the light A', B', C', and D' obliquely incident to the unit pixel P2 intrude into the adjacent unit pixels P1 and P3 and influence the unit pixels P1 and P3. Accordingly, cross talk between the unit pixels P1, P2, and P3 occurs in the comparative image sensor 10C of FIG. 5, thereby increasing noise.

FIGS. 6 to 9 are cross-sectional views that illustrate a method of manufacturing an image sensor, according to an embodiment of the inventive concept.

in particular, FIGS. 6 to 9 illustrate an embodiment of a method of manufacturing the image sensor 10 of FIG. 3A. In FIGS. 6 to 9, like reference numerals denote like members.

Figure 6:
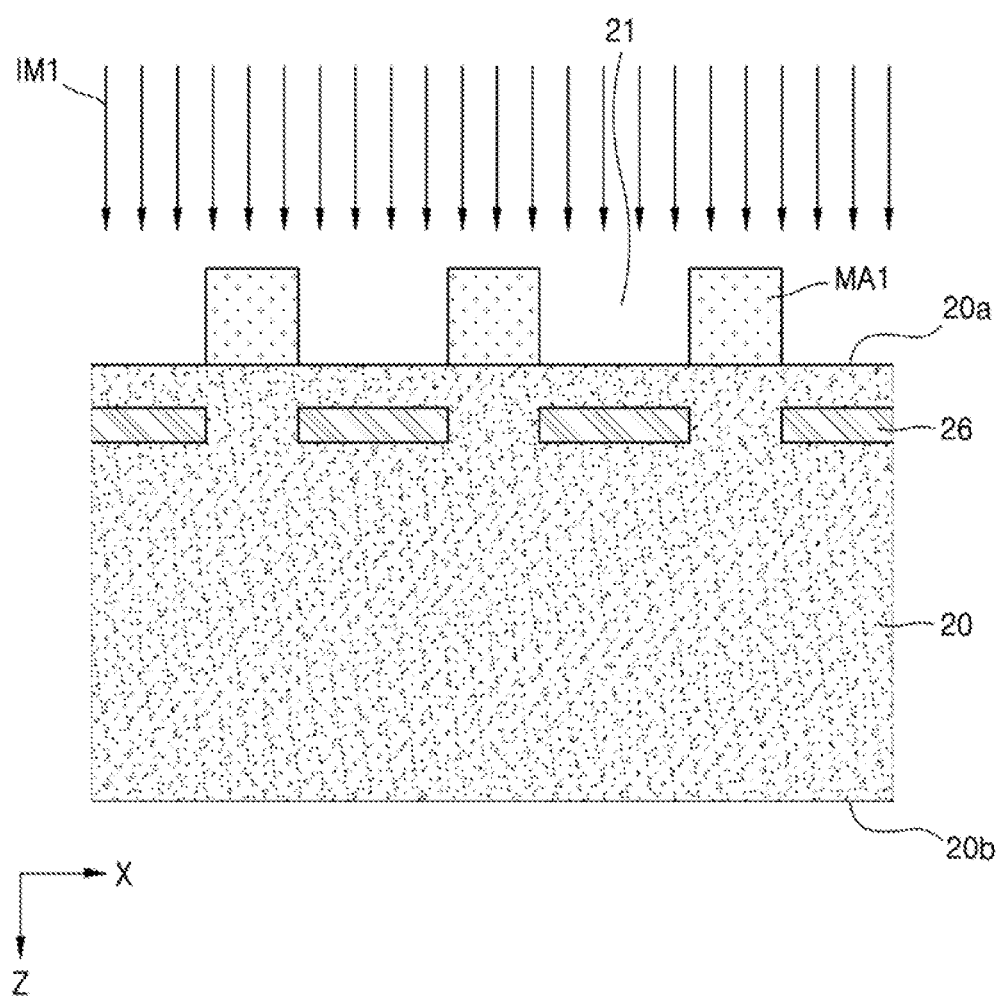
FIGS. 6 to 9 are cross-sectional views that illustrate a method of manufacturing an image sensor according to an embodiment of the inventive concept.

Referring to FIG. 6, according to some embodiments, the substrate 20 that has the first surface 20a and the second surface 20b is prepared. As described above, the first surface 20a is the upper surface or the front surface of the substrate 20. The second surface 20b is the lower surface or the back surface of the substrate 20.

In some embodiments, first mask layers MA1 that have first openings 21 through which a portion of the first surface 20a is exposed are formed on the first surface 20a. The first mask layers MA1 are photoresist patterns. The first mask layers MA1 are formed by a photolithography process.

Then, in some embodiments, the partition layers 26 are formed by performing an oxygen ion implantation process IM1 that implants oxygen ions on the first surface 20a by using the first mask layers MA1 as an ion implantation mask, and then performing annealing. In some embodiments, a dose of oxygen in the oxygen ion implantation process IM1 may be $2\text{-}5\times10^{17}/\text{cm}^2$ to $2\text{-}5\times10^{18}/\text{cm}^2$. The oxygen implantation energy in the oxygen ion implantation process IM1 is about 200 Kev to 300 KeV. In some embodiments, an annealing temperature is about 1100° C. to 1300° C. In some embodiments, the partition layers 26 has a thickness of 200 Å to 500 Å.

As described above, in some embodiments, the partition layers 26 is formed by a SIMOX process. The partition layers 26 are silicon oxide layers. The partition layers 26 are formed in the substrate 20 under the first openings 21, respectively. The partition layers 26 are buried in the substrate 20.

Figure 7:
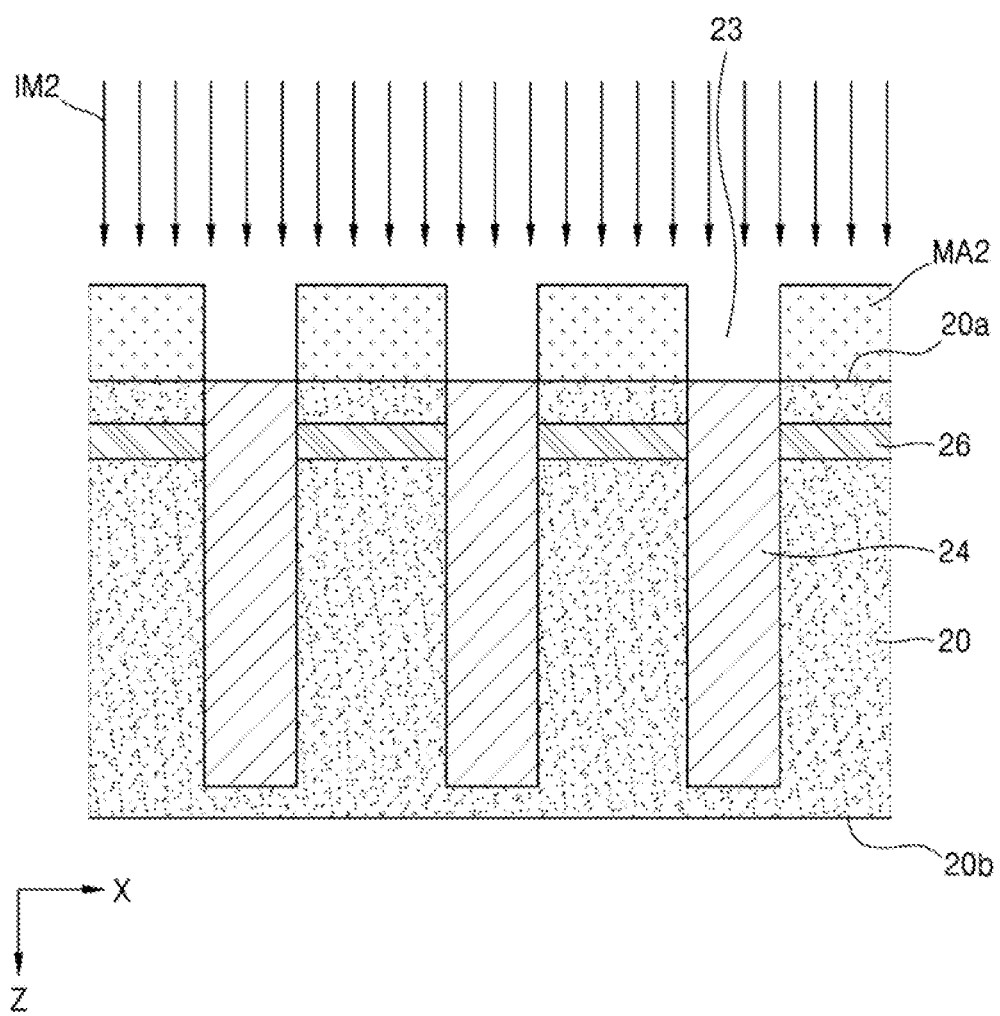

Referring to FIG. 7, in some embodiments, the first mask layers MA1 are removed. Then, second mask layers MA2 that have second openings 23 through which a portion of the first surface 20*a* is exposed are formed on the first surface 20*a* and above the partition layers 26, respectively. The second mask layers MA2 are photoresist patterns. The second mask layers MA2 are formed by a photolithography process.

Then, in some embodiments, the photoelectric conversion regions 24 are formed by performing an photoelectric conversion impurity ion implantation process IM2 that implants photoelectric conversion impurity ions on the first surface 20*a* by using the second mask layers MA2 as an ion implantation mask, and then performing annealing. The photoelectric conversion impurity ions form photodiode regions. The photoelectric conversion impurity ions may be N-type or P-type impurity ions.

As described above, in some embodiments, the photoelectric conversion regions 24 are photodiode regions. The photoelectric conversion regions 24 may include a P-type impurity region or an N-type impurity region.

Figure 8:
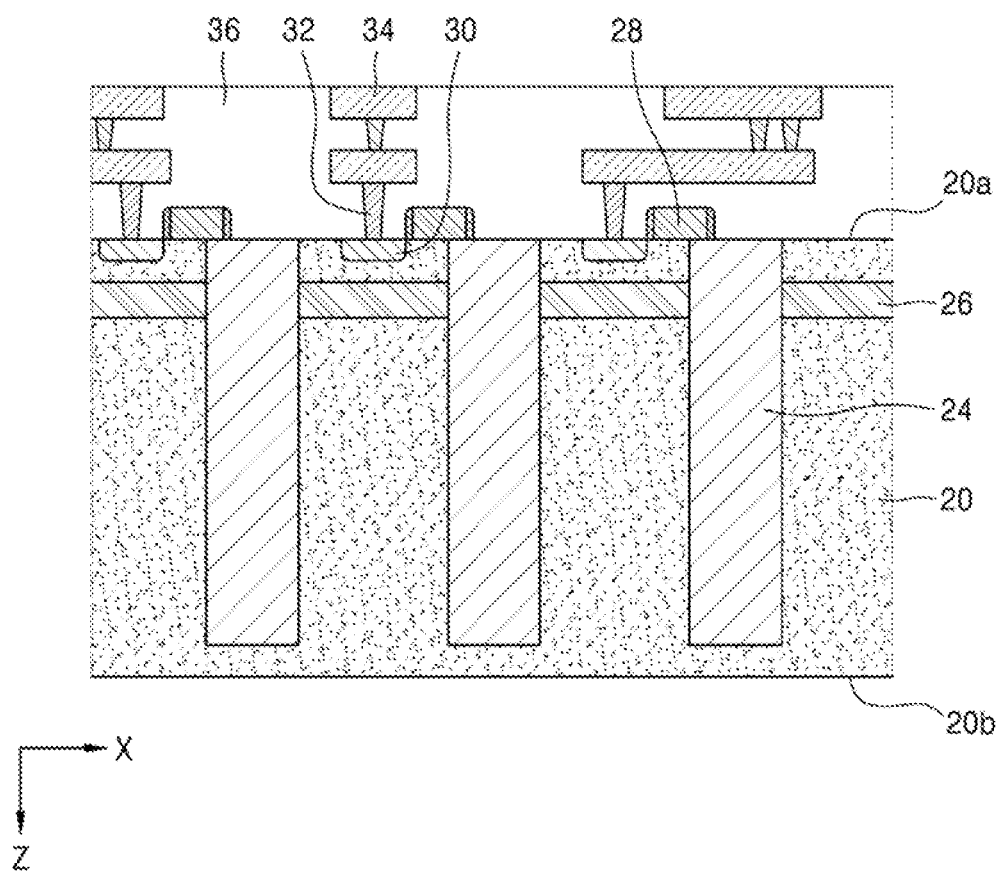

Referring to FIG. 8, in some embodiments, the second mask layers MA2 are removed. The transistor 28 and 30 is formed on the first surface 20*a* of the substrate 20 on which the photoelectric conversion regions 24 is formed. The transistor 28 and 30 is the transmit transistor TX of the pixel circuit 15 of FIG. 2. The transmit transistor TX includes the gate 28 and the floating diffusion region 30. For convenience of illustration, FIG. 8 shows only the transmit transistor TX.

In some embodiments, the multi-layer wiring structure 32, 34, and 36 is formed on the transistor 28 and 30 on the first surface 20*a*. The multi-layer wiring structure 32, 34, and 36 includes the via wiring layer 32 connected to the floating diffusion region 30, the multi-layer wiring layer 34 connected to the via wiring layer 32, and the interlayer insulating layer 36 that insulates the via wiring layer 32 from the multi-layer wiring layer 34.

Figure 9:
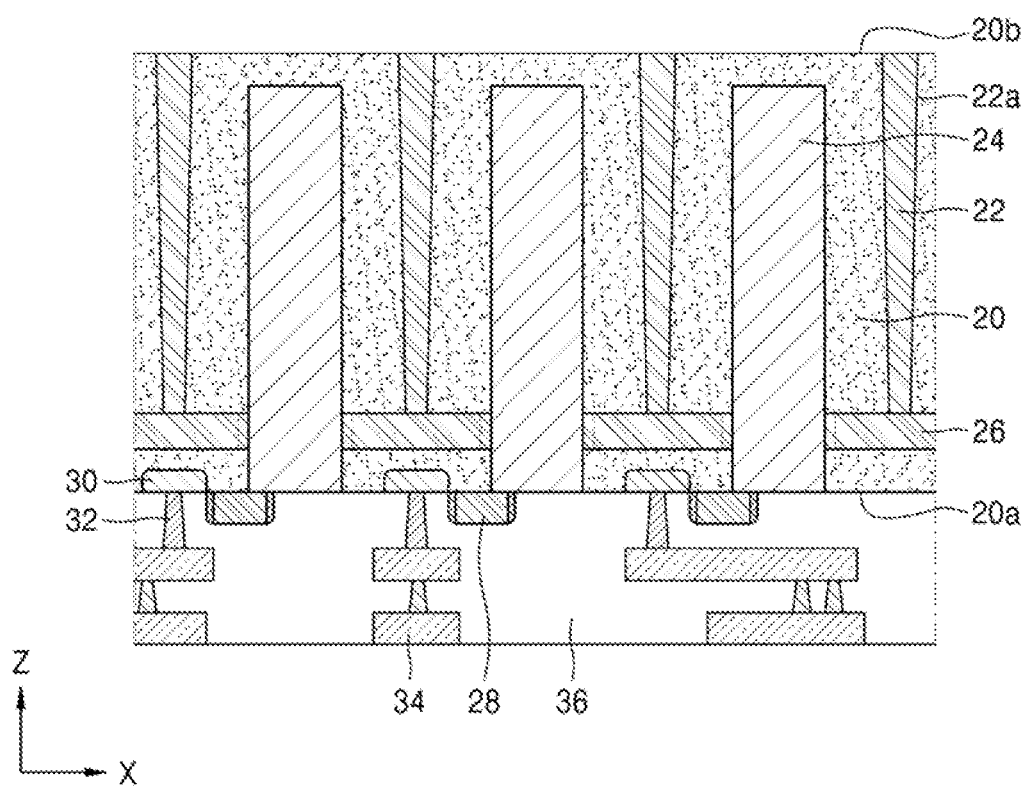

Referring to FIG. 9, in some embodiments, the substrate 20 is turned over and then selectively etched to form the trenches 22*a* in the substrate that extend from the second surface 20*b* to the first surface 20*a*. The trenches 22*a* are formed by a photolithography process.

In some embodiments, the trenches 22*a* are formed to be spaced apart from each other in the X direction. The trenches 22*a* are located between the photoelectric conversion regions 24. The trenches 22*a* are formed to be aligned with respective partition layers 26.

In some embodiments, the pixel separation layers 22 are formed by burying material layers in the trenches 22*a*. The pixel separation layers 22 include a metal oxide or an insulating material. In some embodiments, the metal oxide is one of a hafnium oxide, an aluminum oxide, or a tantalum oxide, etc. In some embodiments, the insulating material is one of a silicon oxide, a silicon nitride, or a silicon oxynitride, etc.

Then, in some embodiments, the color filter layers 38*a*, 38*b*, and 38*c* separated by the grid layers 40 are formed on the second surface 20*b*. Then, the lens layer 42 and the lens protection layer 44 are formed on the color filter layers 38*a*, 38*b*, and 38*c* and the grid layers 40.

Figure 10:
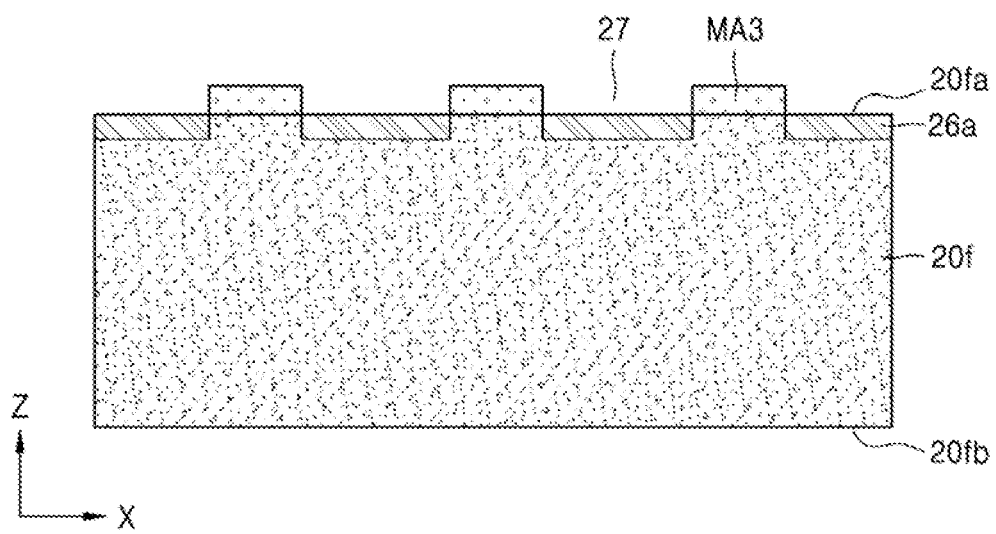
FIGS. 10 to 12 are cross-sectional views that illustrate a method of manufacturing an image sensor according to an embodiment of the inventive concept.
Figure 11:
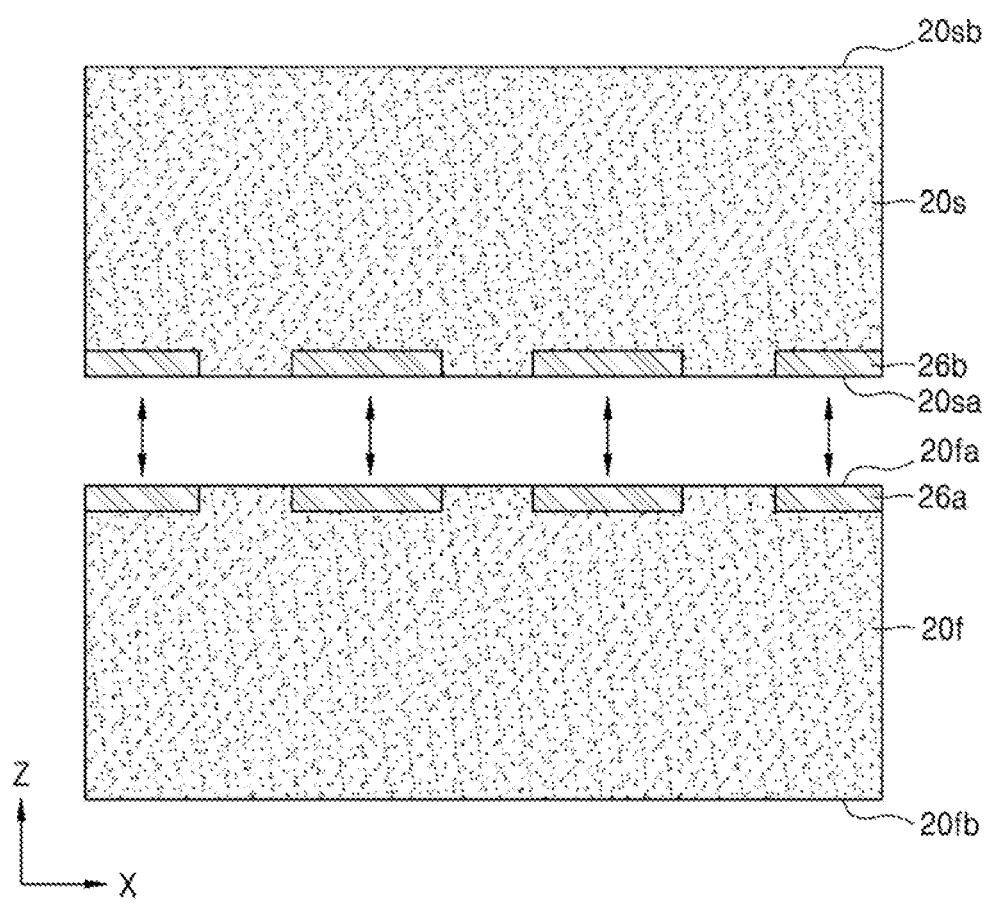
Figure 12:
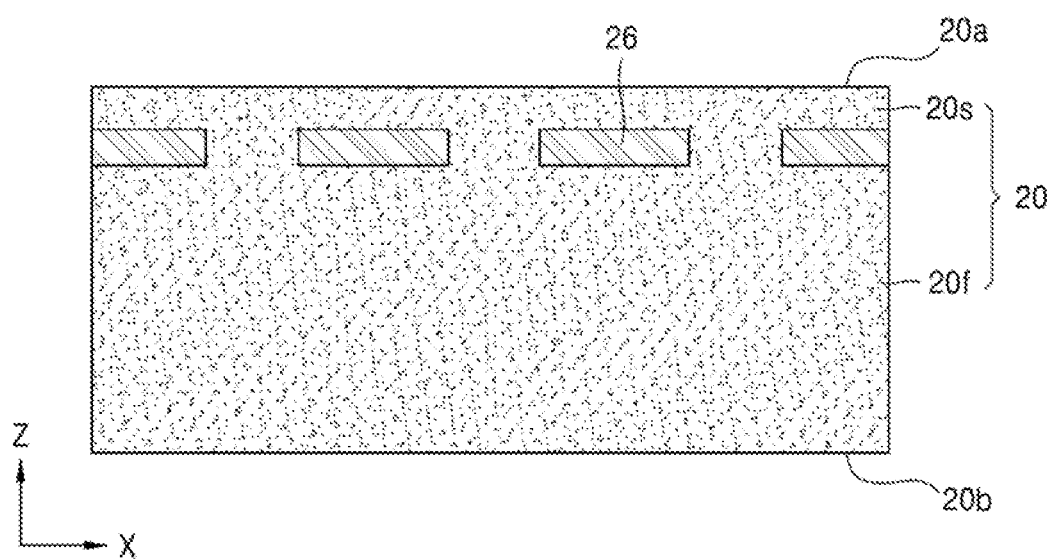

FIGS. 10 to 12 are cross-sectional views that illustrate a method of manufacturing an image sensor, according to an embodiment of the inventive concept.

In particular, FIGS. 10 to 12 illustrate an embodiment of a method of manufacturing the image sensor 10 of FIG. 3A. FIGS. 10 to 12 illustrate an embodiment of a method of manufacturing the partition layers 26 of FIG. 3A. In FIGS. 10 to 12, like reference numerals denote like members.

Referring to FIG. 10, in some embodiments, a first sub-substrate 20*f* is prepared that has a first surface 20*fa* and a second surface 20*fb* opposite to the first surface 20*fa*. Third mask layers MA3 that have third openings 27 through which a portion of the first surface 20*fa* is exposed are formed on the first surface 20*fa* of the first sub-substrate 20*f*.

In some embodiments, the third mask layers MA3 are photoresist patterns. The third mask layers MA3 are formed by a photolithography process. First sub-partition layers 26*a* are selectively formed in the third openings 27. The first sub-partition layers 26*a* are formed by selectively oxidizing a portion of the first sub-substrate 20*f*. The first sub-partition layers 26*a* are silicon oxide layers.

Referring to FIG. 11, in some embodiments, a second sub-substrate 20*s* is prepared that has a first surface 20*sa* and a second surface 20*sb* opposite to the first surface 20*sa*. Second sub-partition layers 26*b* are formed on the first surface 20*sa* of the second sub-substrate 20*s* in the same manner as described with reference to FIG. 10. The second sub-partition layers 26*b* are formed by selectively oxidizing a portion of the second sub-substrate 20*s*. The second sub-partition layers 26*b* are silicon oxide layers.

Then, in some embodiments, the first surface 20*fa* of the first sub-substrate 20*f* and the first surface 20*sa* of the second sub-substrate 20*s* are positioned to face each other and are bonded to each other. The first surface 20*fa* of the first sub-substrate 20*f* and the first surface 20*sa* of the second sub-substrate 20*s* are bonded so that the first sub-partition layers 26*a* of the first sub-substrate 20*f* and the second sub-partition layers 26*b* of the second sub-substrate 20*s* face each other.

In FIGS. 10 and 11, in some embodiments, the first sub-substrate 20*f* and the second sub-substrate 20*s* are bonded after the first sub-partition layers 26*a* and the second sub-partition layers 26*b* are respectively formed on the first sub-substrate 20*f* and the second sub-substrate 20*s*, but according to embodiments, sub-partition layers may be formed only on one of the first sub-substrate 20*f* or the second sub-substrate 20*s*.

As shown in FIG. 12, in some embodiments, after bonding the first sub-substrate 20*f* and the second sub-substrate 20*s*, a thickness of the second sub-substrate 20*s* is decreased by chemical mechanical polishing. In other words, the thickness of the second sub-substrate 20*s* is decreased by performing chemical mechanical polishing on the second sub-substrate 20*s* in a direction from the second surface 20*sb* to the first surface 20*sa*.

By doing this, in some embodiments, the partition layers 26 are formed in the substrate 20 that includes the first sub-substrate 20*f* and the second sub-substrate 20*s*. The partition layers 26 are material layers in which the first sub-partition layers 26*a* and the second sub-partition layers 26*b* are bonded.

Figure 13:
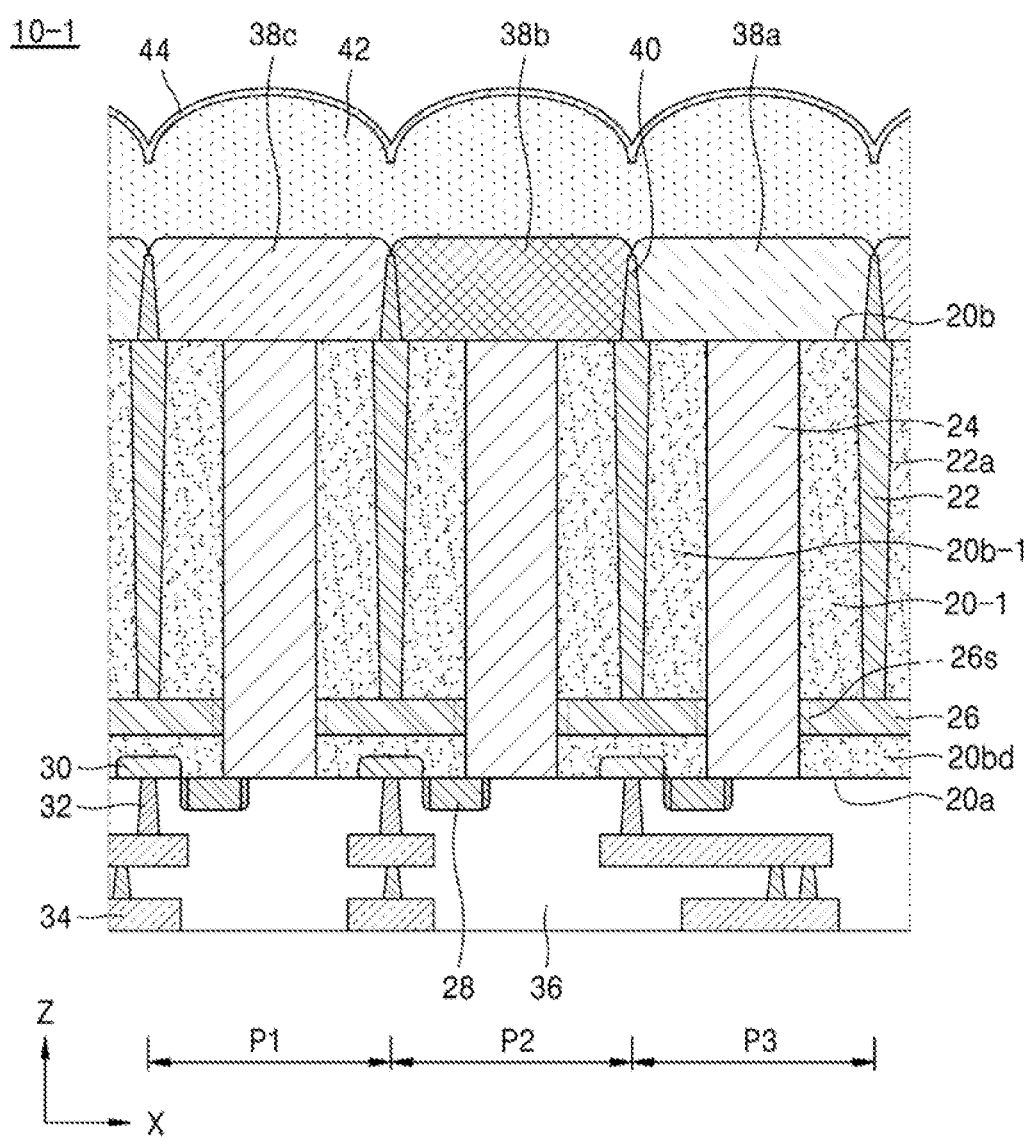
FIG. 13 is a cross-sectional view of an image sensor according to an embodiment of the inventive concept.

FIG. 13 is a cross-sectional view of an image sensor 10-1 according to an embodiment of the inventive concept.

In particular, in some embodiments, as compared to the image sensor 10 of FIG. 3A, the image sensor 10-1 of FIG. 13 is similar to the image sensor 10 of FIG. 3A except that the image sensor 10-1 of FIG. 13 does not include the second substrate body layer 20bd. In FIG. 13, like reference numerals denote like members in FIG. 3A. A repeated description of components described with reference to FIG. 3A is omitted.

In some embodiments, the image sensor 10-1 includes the substrate 20, the pixel separation layers 22, the photoelectric conversion regions 24, and the partition layers 26. The substrate 20 has the first surface 20a and the second surface 20b opposite to the first surface 20a. The first surface 20a is the upper surface or the front surface of the substrate 20. The second surface 20b is the lower surface or the back surface of the substrate 20.

Unlike FIG. 3A, the image sensor 10-1 according to an embodiment does not include the second substrate body layer 20bd of FIG. 3A on the photoelectric conversion regions 24. The color filter layers 38a, 38b, and 38c and the lens layer 42 are located on the second surface 20b and the photoelectric conversion regions 24 of the substrate 20.

In the image sensor 10-1, according to an embodiment, the color filter layers 38a, 38b, and 38c are formed directly on the photoelectric conversion regions 24. When chemical mechanical polishing is performed on the second surface 20b of the substrate 20, the image sensor 10-1 does not include the second substrate body layer 20bd of FIG. 3A. Accordingly, the image sensor 10-1 can obtain a clear image by forming the color filter layers 38a, 38b, and 38c in direct contact with the photoelectric conversion regions 24.

Figure 14:
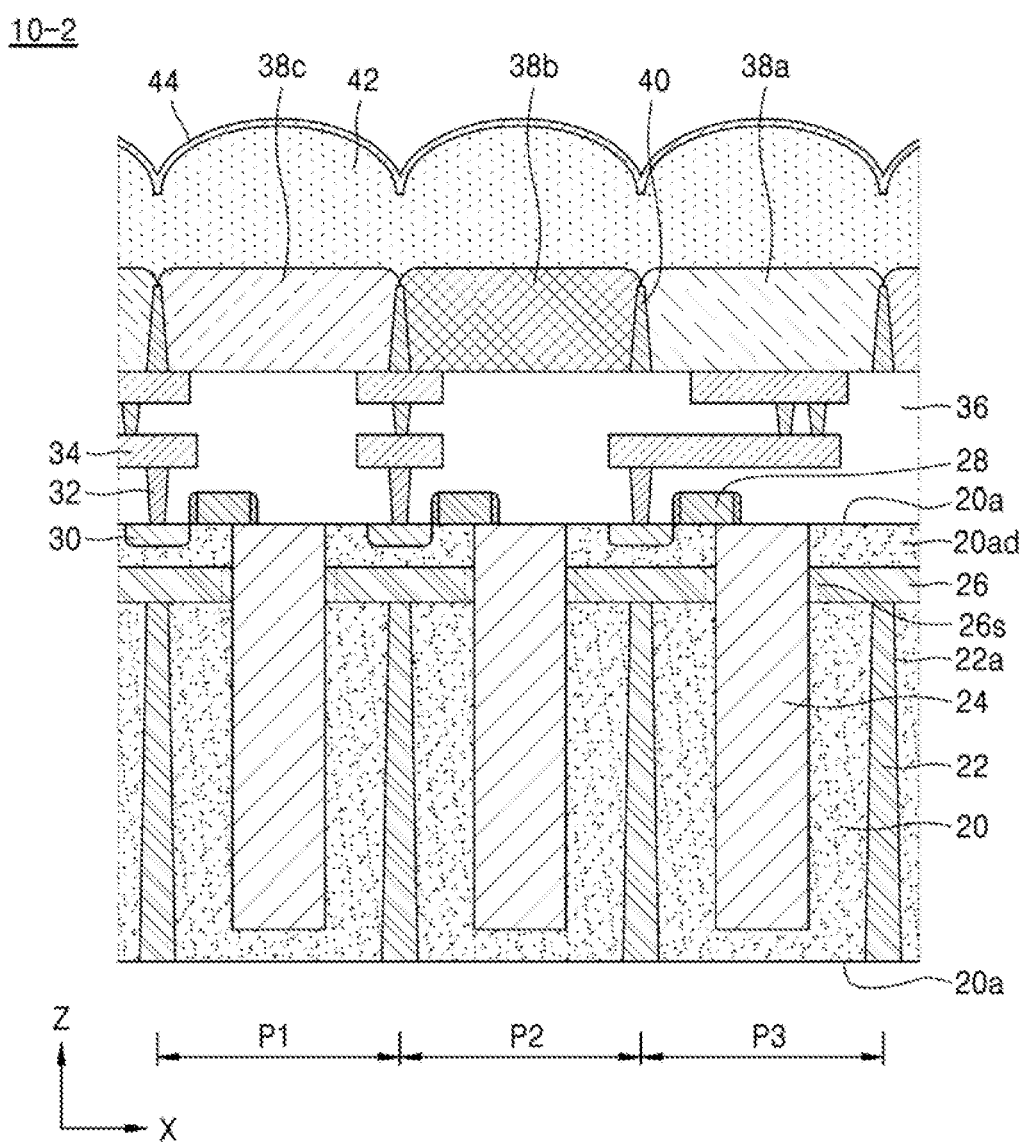
FIG. 14 is a cross-sectional view of an image sensor according to an embodiment of the inventive concept.

FIG. 14 is a cross-sectional view of an image sensor 10-2 according to an embodiment of the inventive concept.

in particular, according to an embodiment, as compared to the image sensor 10 of FIG. 3A, the image sensor 10-2 of FIG. 14 is similar to the image sensor 10 of FIG. 3A except that the color filter layers 38a, 38b, and 38c, the grid layers 40, the lens layer 42, the lens protection layer 44, etc., are formed on the multi-layer wiring structure 32, 34, and 36. In FIG. 14, like reference numerals denote like members. A repeated description of components described with reference to FIG. 3A is omitted.

According to an embodiment, the image sensor 10-2 includes the substrate 20, the pixel separation layers 22, the photoelectric conversion regions 24, and the partition layers 26. The substrate 20 has the first surface 20a and the second surface 20b opposite to the first surface 20a. The first surface 20a is the upper surface or the front surface of the substrate 20. The second surface 20b is the lower surface or the back surface of the substrate 20.

According to an embodiment, in the image sensor 10-2, the partition layers 26 are spaced apart the first surface 20a and are located between the photoelectric conversion regions 24. In the image sensor 10-2, the color filter layers 38a, 38b, and 38c, the grid layers 40, the lens layer 42, and the lens protection layer 44 are formed on the multi-layer wiring structure 32, 34, and 36 on the first surface 20a of the substrate 20.

According to an embodiment, the image sensor 10-2 is a front illuminated image sensor in which light is incident to the first surface 20a, i.e., the front surface, of the substrate 20. In the image sensor 10-2, the partition layers 26 are located between the photoelectric conversion regions 24 to suppress cross talk between the unit pixels P1, P2, and P3, thereby reducing noise.

Figure 15:
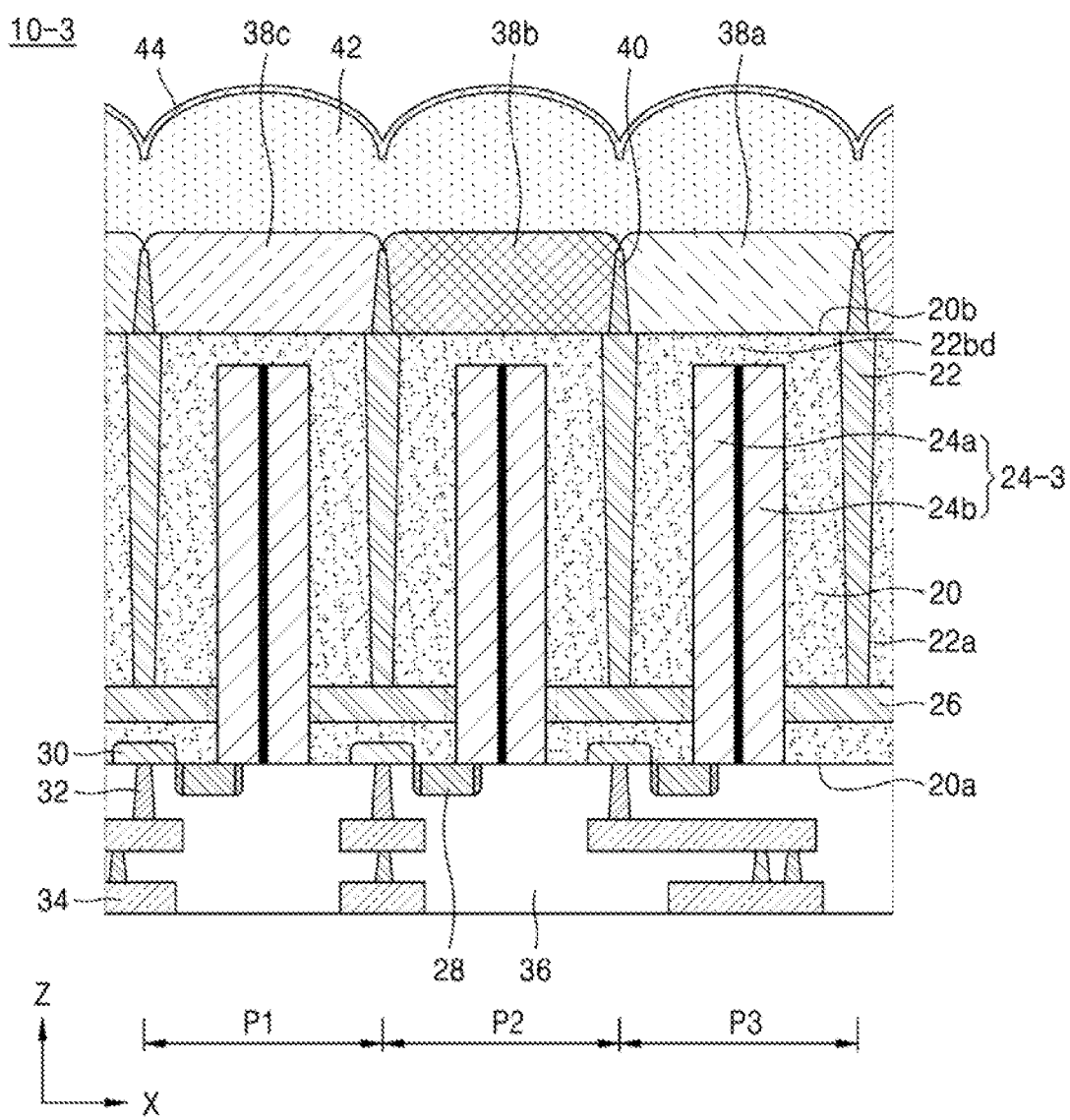
FIG. 15 is a cross-sectional view of an image sensor according to an embodiment of the inventive concept.

FIG. 15 is a cross-sectional view of an image sensor 10-3 according to an embodiment of the inventive concept.

In particular, according to an embodiment, as compared to the image sensor 10 of FIG. 3A, the image sensor 10-3 of FIG. 15 is similar to the image sensor 10 of FIG. 3A except that the image sensor 10-3 of FIG. 15 includes photoelectric conversion regions 24-3 that each include sub-photoelectric conversion regions 24a and 24b. In FIG. 15, like reference numerals denote like members. A repeated description of components described with reference to FIG. 3A is omitted.

According to an embodiment, the image sensor 10-3 includes the substrate 20, the pixel separation layers 22, the photoelectric conversion regions 24-3, and the partition layers 26. The image sensor 10-3 includes the photoelectric conversion region 24-3 in each of the unit pixels P1, P2, and P3. Each of the photoelectric conversion regions 24-3 includes a plurality of sub-photoelectric conversion regions 24a and 24b.

According to an embodiment, although FIG. 15 shows that each of the photoelectric conversion regions 24-3 includes two sub-photoelectric conversion regions 24a and 24b, embodiments of the inventive concept are not limited thereto, and each of the photoelectric conversion regions 24-3 may include a greater number of sub-photoelectric conversion regions, such as four sub-photoelectric conversion regions.

According to an embodiment, the sub-photoelectric conversion regions 24a and 24b are photodiode regions. Each sub-photoelectric conversion region 24a and 24b may be a P-type impurity region or an N-type impurity region.

According to an embodiment, in the image sensor 10-3, the partition layers 26 are spaced apart from the first surface 20a and are located between the photoelectric conversion regions 24-3. In the image sensor 10-3, the partition layers 26 are located between the photoelectric conversion regions 24-3 to suppress cross talk between the unit pixels P1, P2, and P3, thereby reducing noise.

Figure 16:
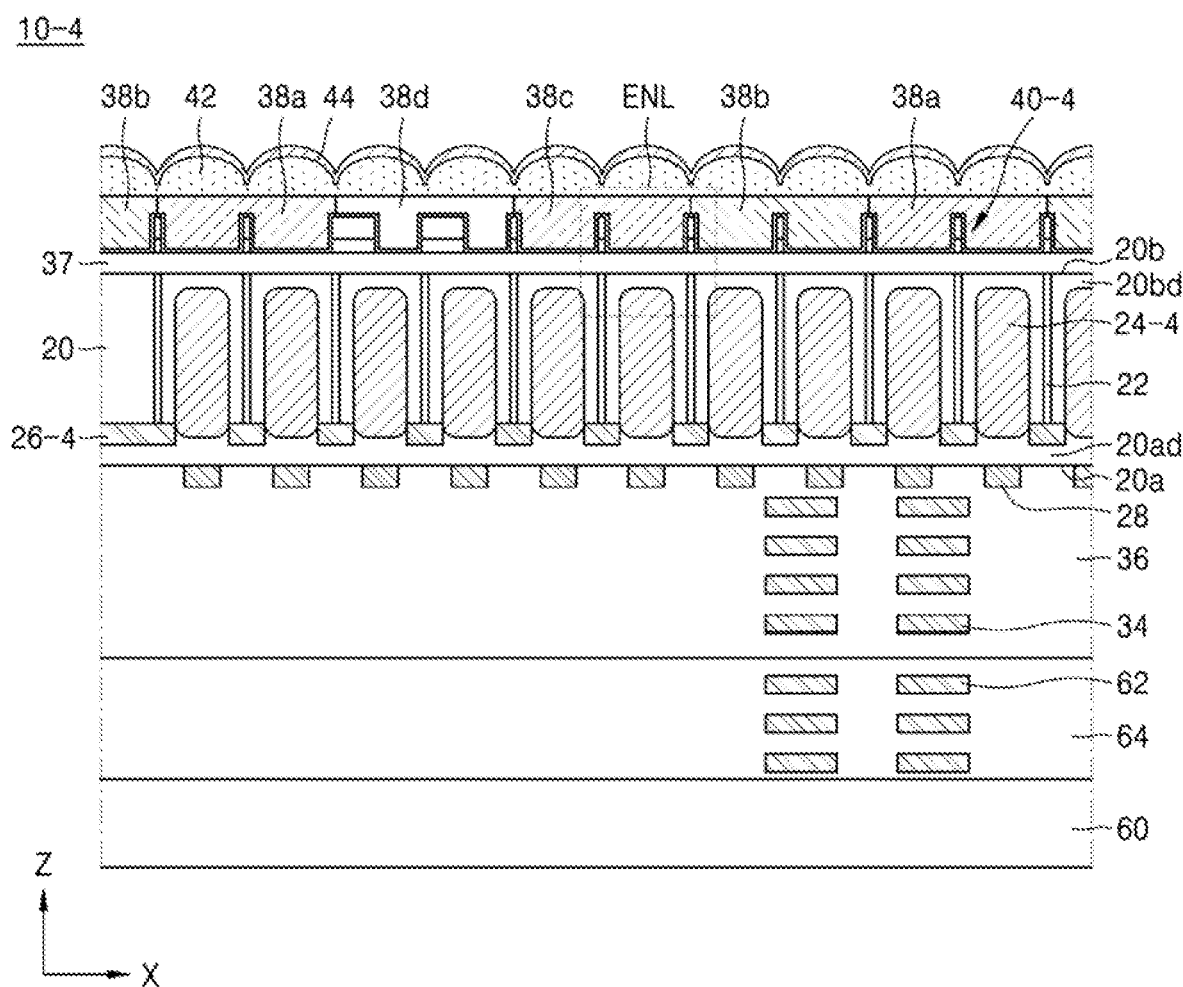
FIG. 16 is a cross-sectional view of an image sensor according to an embodiment of the inventive concept.
Figure 17:
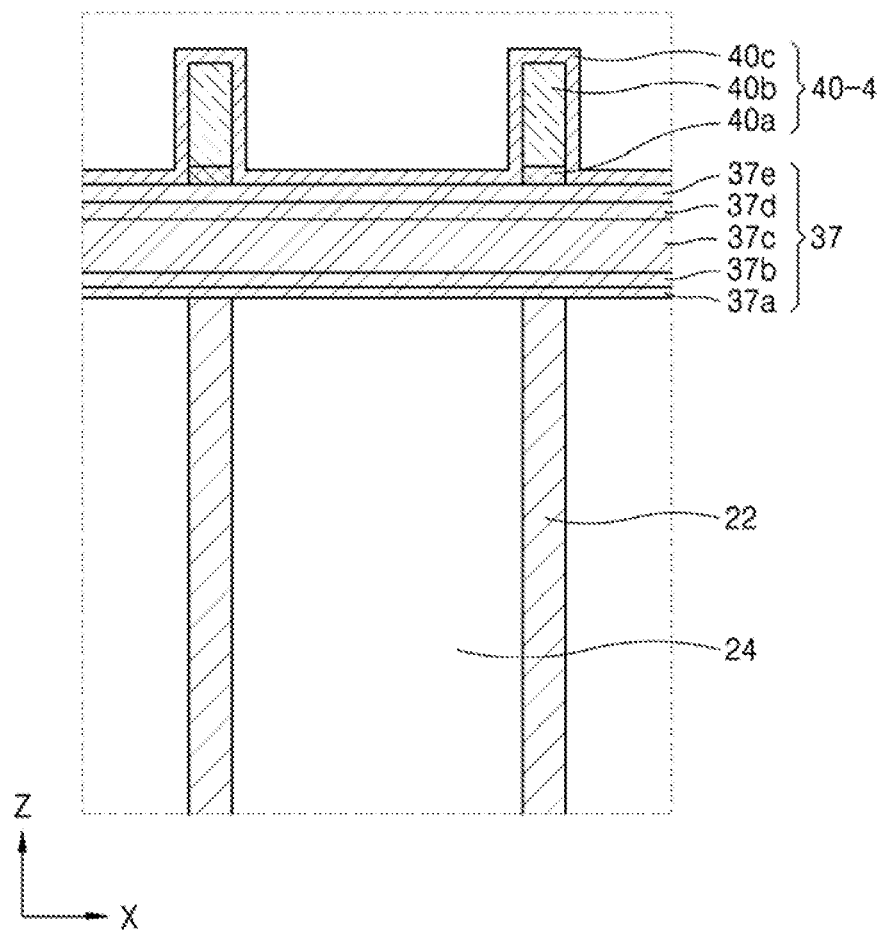
FIG. 17 is a partially magnified view of FIG. 16.

FIG. 16 is a cross-sectional view of an image sensor 10-4 according to an embodiment of the inventive concept, and FIG. 17 is a partially magnified view of FIG. 16.

In particular, FIG. 17 is a magnified view of a region ENL of FIG. 16. The image sensor 10-4 of FIG. 16 is an example of an implementation of a technical idea of the inventive concept. In FIGS. 16 and 17, like reference numerals denote like members. A repeated description of components made with reference to FIG. 3A is omitted.

According to an embodiment, the image sensor 10-4 includes the substrate 20, the pixel separation layers 22, photoelectric conversion regions 24-4, and partition layers 26-4. The substrate 20 has the first surface 20a and the second surface 20b opposite to the first surface 20a. The first surface 20a is the upper surface or the front surface of the substrate 20. The second surface 20b is the lower surface or the back surface of the substrate 20. In some embodiments, the substrate 20 is a silicon substrate.

According to an embodiment, the photoelectric conversion regions 24-4 are located in the substrate 20. The photoelectric conversion regions 24-4 do not come in contact with the first surface 20a. The partition layers 26-4 are spaced apart from the first surface 20a and are located between the photoelectric conversion regions 24-4. The pixel separation layers 22 are located on the partition layers 26-4 to separate the photoelectric conversion regions 24-4 from each other.

According to an embodiment, in the image sensor 10-4, the first substrate body layer 20ad is located under the partition layers 26-4. The first substrate body layer 20ad is a part of the substrate 20. The gate 28 is located on the first surface 20a of the substrate 20. The gate 28 is a gate of a planar transistor. For convenience of illustration, FIG. 16 does not show other gates of a floating diffusion region and a pixel circuit.

According to an embodiment, a multi-layer wiring structure 34 and 36 is located on the gate 28 and the first surface 20a. The multi-layer wiring structure 34 and 36 includes the multi-wiring layer 34 and the interlayer insulating layer 36 that insulates layers of the multi-wiring layers 34 from each other. For convenience of illustration, FIG. 16 does not show a via wiring layer that connects the multi-wiring layers 34.

According to an embodiment, a second multi-layer wiring structure 62 and 64 and a second substrate 60 are located under the multi-layer wiring structure 34 and 36. The second multi-layer wiring structure 62 and 64 include a second multi-wiring layer 62 and a second interlayer insulating layer 64 that insulates layers of the second multi-wiring layers 62 from each other. For convenience of illustration, FIG. 16 does not show a via wiring layer that connects the multi-wiring layers 62. The second substrate 60 may correspond to the second substrate 7 of FIG. 1. The second substrate 60 is a support substrate that supports the substrate 20 and includes a logic circuit that drives a pixel circuit.

According to an embodiment, in the image sensor 10-4, the second substrate body layer 20bd is located on the photoelectric conversion regions 24-4. The second substrate body layer 20bd is a part of the substrate 20. A multi-insulating layer 37 is located on the second surface 20b and the second substrate body layer 20bd. The multi-insulating layer 37 includes a plurality of insulating layers 37a, 37b, 37c, 37d, and 37e. The multi-insulating layer 37 is formed of one or more of an aluminum oxide, a hafnium oxide, a silicon oxide, and a silicon nitride, taken alone or in combination.

According to an embodiment, color filter layers 38a, 38b, 38c, and 38d are located on the multi-insulating layer 37. In some embodiments, the color filter layers 38a, 38b, 38c, and 38d include the red color filter layer 38a, the blue color filter layer 38b, the green color filter layer 38c, and a white color filter layer 38d.

According to an embodiment, grid layers 40-4 are located between the color filter layers 38a, 38b, 38c, and 38d. The grid layers 40-4 include a plurality of insulating layers 40a, 40b, and 40c. The lens layer 42 is located on the color filter layers 38a, 38b, 38c, and 38d and the grid layers 40-4, and the lens protection layer 44 is located on the lens layer 42.

According to an embodiment, in the image sensor 10-4, the partition layers 26-4 are located between the photoelectric conversion regions 24-4 to suppress cross talk between unit pixels, thereby reducing noise.

Figure 18:
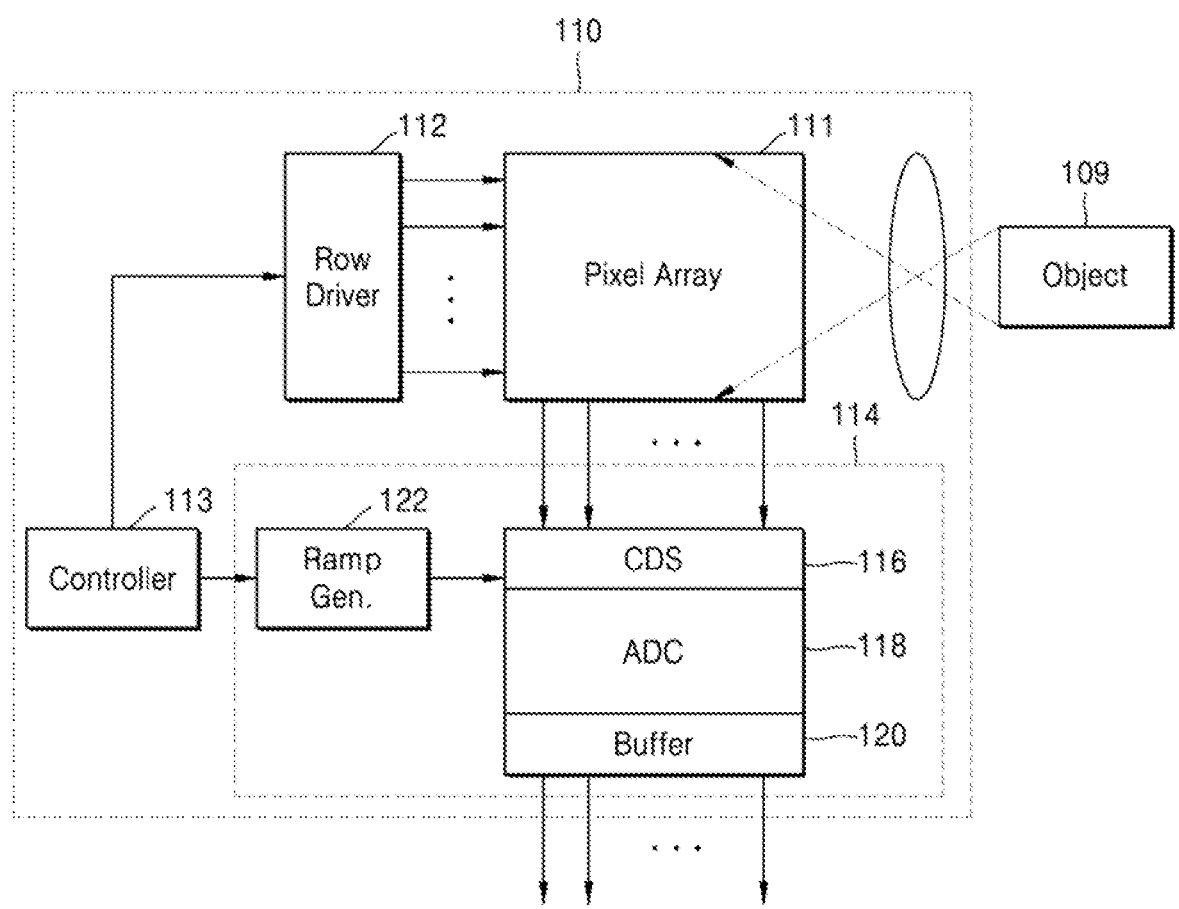
FIG. 18 is a block diagram of an image sensor according to an embodiment of the inventive concept.

FIG. 18 is a block diagram of an image sensor 110 according to an embodiment of the inventive concept.

In particular, according to an embodiment, the image sensor 110 includes a pixel array 111, a controller 113, a row driver 112, and a pixel signal processor 114. The image sensor 110 includes at least one of the image sensors 10, 10-1, 10-2, 10-3, or 10-4 described above.

According to an embodiment, the pixel array 11 includes a plurality of unit pixels that are two-dimensionally arranged, and each unit pixel includes a photoelectric conversion element. The photoelectric conversion element generates charges by absorbing light from object 109, and outputting an electrical signal based on the generated charges to the pixel signal processor 114 through a vertical signal line. The unit pixels in the pixel array 111 sequentially provide an output voltage for each row unit.

Accordingly, in an embodiment, unit pixels that belong to one row in the pixel array 111 are simultaneously activated by a selection signal received from the row driver 112. Unit pixels that belong to a selected row provide an output voltage based on the absorbed light to an output line of a corresponding column.

According to an embodiment, the controller 113 controls the row driver 112 so that the pixel array 111 accumulates charges by absorbing light, temporarily stores the accumulated charges, and outputs an electrical signal based on the stored charges. In addition, the controller 113 controls the pixel signal processor 114 to measure an output voltage provided by the pixel array 111.

According to an embodiment, the pixel signal processor 114 includes a correlated double sampler (CDS) 116, an analog-digital converter (ADC) 118, and a buffer 120. The CDS 116 samples and holds the output voltage received from the pixel array 111. The CDS 116 samples both a particular noise level and a level according to the measured output voltage and outputs a level corresponding to a difference between the sampled levels. In addition, the CDS 116 receives a ramp signal generated by a ramp signal generator 122, compares the ramp signal to the electrical signal provided by the pixel array 111, and outputs the comparison result. The ADC 118 converts an analog signal that corresponds to the level received from the CDS 116 into a digital signal. The buffer 120 latches the digital signal, and the latched signal is sequentially output and transmitted to an image processor.

Figure 19:
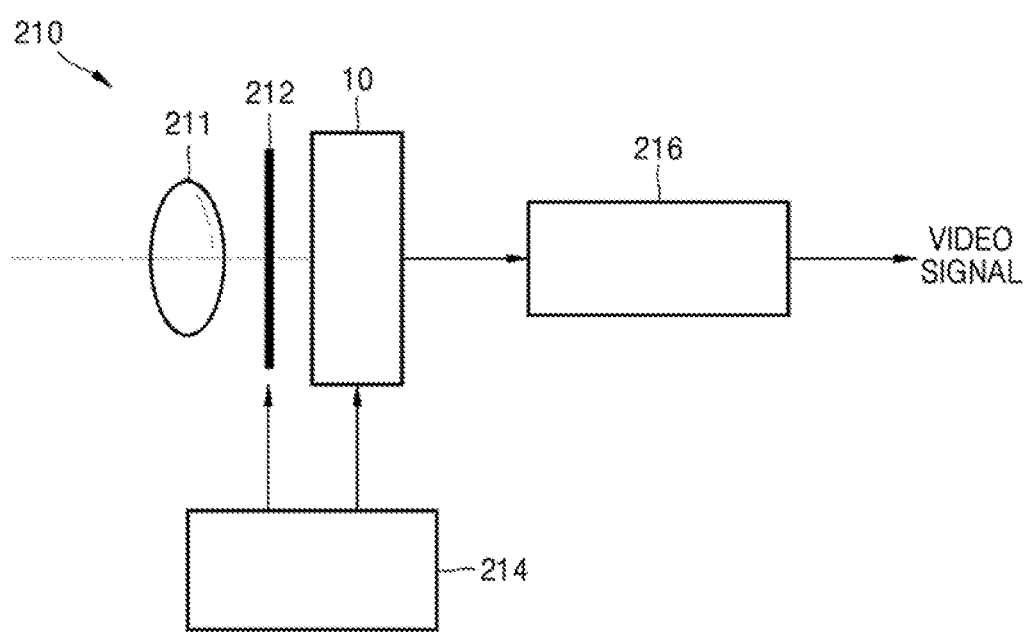
FIG. 19 is a block diagram of a camera that uses an image sensor, according to an embodiment of the inventive concept.

FIG. 19 is a block diagram of a camera 210 that uses the image sensor 10, according to an embodiment of the inventive concept.

In particular, according to an embodiment, the camera 210 includes the image sensor 10 described above, an optical system 211 that guides incident light to a light-receiving sensor in the image sensor 10, a shutter device 212, a driving circuit 214 that drives the image sensor 10, and a signal processing circuit 216 that processes an output signal of the image sensor 10.

According to an embodiment, the image sensor 10 corresponds to at least one of the image sensors 10-1, 10-2, 10-3, or 10-4 described above. The optical system 211 includes an optical lens and forms an image on an image pickup surface of the image sensor 10 by using image light, i.e., incident light, from an object. By doing this, signal charges are accumulated in the image sensor 10 for a certain period of time.

According to an embodiment, the optical system 211 is an optical lens system that includes a plurality of optical lenses. The shutter device 212 controls a light emission time and a light-blocking time for the image sensor 10. The driving circuit 214 supplies a driving signal to the image sensor 10 and the shutter device 212 and controls a signal output operation of the image sensor 10 to the signal processing circuit 216 and a shutter operation of the shutter device 212 in response to the supplied driving signal or a timing signal.

According to an embodiment, the driving circuit 214 controls a signal transmission operation from the image sensor 10 to the signal processing circuit 216 by supplying the driving signal or the timing signal. The signal processing circuit 216 performs various signal processing operations on the signal transmitted from the image sensor 10. An image or video signal on which signal processing has been performed is recorded in a recording medium such as a memory or is output to a monitor.

Figure 20:
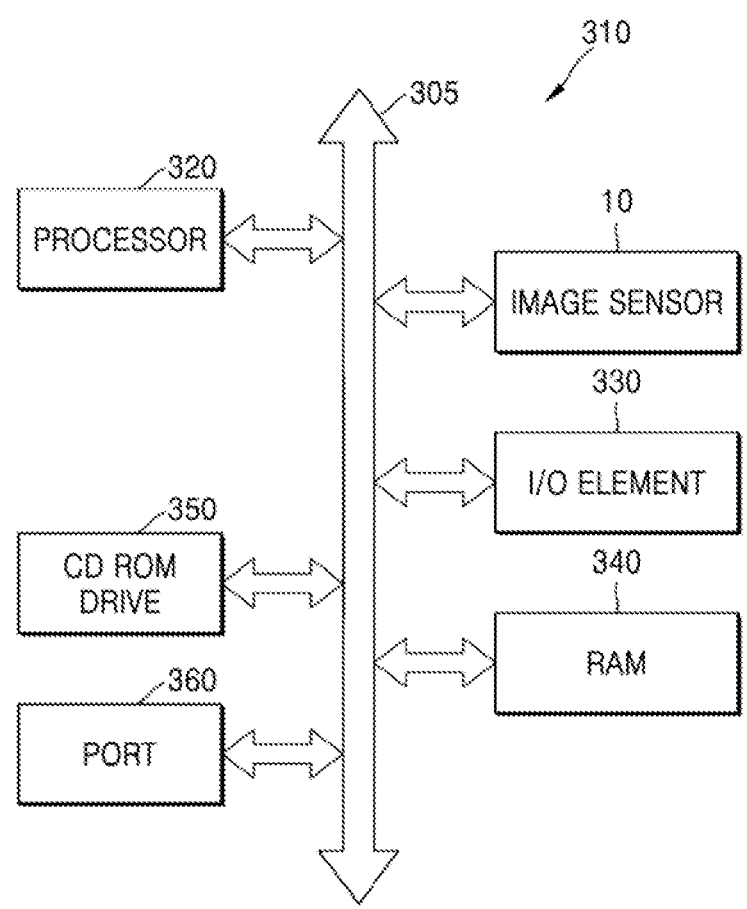
FIG. 20 is a block diagram of an imaging system that includes an image sensor, according to an embodiment of the inventive concept.

FIG. 20 is a block diagram of an imaging system 310 that includes the image sensor 10, according to an embodiment of the inventive concept.

In particular, the imaging system 310 processes an output image of the image sensor 10 described above. The image sensor 10 corresponds to at least one of the image sensors 10-1, 10-2, 10-3, or 10-4 described above. The imaging system 310 may be any type of electrical or electronic systems that includes the image sensor 10 therein, such as a computer system, a camera system, or an image stabilization system.

According to an embodiment, a processor-based imaging system 310 such as a computer system includes a processor 320, such as a microprocessor or a central processing unit (CPU), that can communicate with an input/output (I/O) element 330 through a bus 305. The processor 320 is connected to a compact disc read-only memory (CD ROM) drive 350, a port 360, and random access memory (RAM) 340 through the bus 305 to transmit and receive data and reproduce an output image with respect to data of the image sensor 10.

According to an embodiment, the port 360 may be coupled to a video card, a sound card, a memory card, a universal serial bus (USB) element, etc., or may communicate data with another system. The image sensor 10 is integrated with a processor such as a CPU, a digital signal processor (DSP), or a microprocessor, or is integrated with a memory. According to embodiments, the image sensor 10 is integrated as a separate chip from a processor. The imaging system 310 may be a camera phone in a digital device, a digital camera, etc.

While embodiments of the inventive concept have been particularly shown and described with reference to the accompanying drawings, it will be understood that various changes in form and details may be made therein without departing from the spirit and scope of the following claims.

What is claimed is:

1. An image sensor, comprising:
    a substrate that includes a first surface and a second surface that is opposite to the first surface;
    photoelectric conversion regions located in the substrate, the photoelectric conversion regions being separated from each other;
    partition layers spaced apart from the first surface and between the photoelectric conversion regions;
    pixel separation layers located on the partition layers, wherein the pixel separation layers separate the photoelectric conversion regions from each other;
    color filter layers located on the second surface;
    grid layers located between the color filter layers; and
    a transistor and a multi-layer wiring structure located on the first surface,
    wherein the pixel separation layers have a tapered shape whose width decreases in a direction parallel to the second surface as the pixel separation layers extend from the second surface to the first surface,
    wherein one surface of each photoelectric conversion region is coplanar with the first surface of the substrate, and
    wherein the pixel separation layers are in direct contact with the grid layers, and a lower surface of the grid layers in contact with the pixel separation layers is coplanar with the second surface of the substrate.

2. The image sensor of claim 1, wherein each of the photoelectric conversion regions includes a plurality of sub-photoelectric conversion regions.

3. The image sensor of claim 1, wherein the partition layers come into contact with both side surfaces of the photoelectric conversion regions.

4. The image sensor of claim 1, further comprising a first substrate body layer located between the partition layers and the first surface of the substrate.

5. The image sensor of claim 1, wherein the partition layers include separation regions through which the partition layers make contact with the photoelectric conversion regions at both side surfaces of the photoelectric conversion regions.

6. The image sensor of claim 1, wherein the pixel separation layers come in contact with surfaces of the partition layers.

7. The image sensor of claim 1, wherein the pixel separation layers are material layers buried in trenches in the substrate that are aligned with the partition layers and that extend in a direction from the second surface to the first surface.

8. The image sensor of claim 1, wherein the partition layers and the pixel separation layers surround the photoelectric conversion regions at parts of the photoelectric conversion regions that are closer to the first surface of the substrate than the second surface of the substrate.

9. The image sensor of claim 1, further comprising a lens layer located on the second surface.

10. The image sensor of claim 1, further comprising a lens layer located on the first surface.

11. The image sensor of claim 1, further comprising a second substrate body layer located between the photoelectric conversion regions and the second surface of the substrate.

12. An image sensor, comprising:
    a substrate that includes a first surface and a second surface opposite to the first surface; and
    unit pixels located in the substrate between the first surface and the second surface and that are separated from each other,
    wherein each of the unit pixels comprises:
        a photoelectric conversion region located in the substrate;
        partition layers located at both sides of the photoelectric conversion region and separated from the first surface, wherein the partition layers include silicon oxide layers;
        pixel separation layers located on the partition layers, wherein the pixel separation layers are separated from both side surfaces of the photoelectric conversion region;
        color filter layers located on the second surface;
        grid layers located between the color filter layers; and
        a transistor and a multi-layer wiring structure located on the first surface,
        wherein the pixel separation layers have a tapered shape whose width decreases in a direction parallel to the second surface as the pixel separation layers extend from the second surface to the first surface, and
        wherein one surface of the photoelectric conversion region is coplanar with the first surface of the substrate, and
        wherein the pixel separation layers are in direct contact with the grid layers, and a lower surface of the grid layers in contact with the pixel separation layers is coplanar with the second surface of the substrate.

13. The image sensor of claim 12, wherein the partition layers are located at an edge of the unit pixels.

14. The image sensor of claim 12, wherein the partition layers come in contact with the photoelectric conversion regions of the unit pixels.

15. The image sensor of claim 12, wherein the pixel separation layers come in contact with the partition layers at an edge of the unit pixels and are buried in trenches in the substrate that are aligned in the partition layers and that extend in a direction from the second surface to the first surface.

16. An image sensor, comprising:
- a substrate that includes a lower surface and an upper surface opposite to the lower surface;
- photoelectric conversion regions located in the substrate, wherein the photoelectric conversion regions are separated from each other;
- partition layers located closer to the lower surface than the upper surface and at both sides of the photoelectric conversion regions;
- pixel separation layers located in the substrate, wherein the pixel separation layers separate the photoelectric conversion regions from each other by penetrating the substrate from the lower surface to the upper surface between the photoelectric conversion regions on the partition layers, wherein the pixel separation layers have a tapered shape whose width decreases in a direction parallel to the lower surface as the pixel separation layers extend from the lower surface to the upper surface;
- color filter layers located on the upper surface that correspond to the photoelectric conversion regions;
- grid layers located between the color filter layers;
- a lens layer located on the color filter layers; and
- a transistor and a multi-layer wiring structure located on the lower surface,
- wherein one surface of each photoelectric conversion region is coplanar with the lower surface of the substrate, and
- wherein the pixel separation layers are in direct contact with the grid layers, and a lower surface of the grid layers in contact with the pixel separation layers is coplanar with the upper surface of the substrate.

17. The image sensor of claim 16, wherein the partition layers come in contact with both side surfaces of the photoelectric conversion regions, and the pixel separation layers come in contact with upper surfaces of the partition layers.

18. The image sensor of claim 16, further comprising an upper substrate body layer located between the partition layers and the upper surface, and a lower substrate body layer located between the photoelectric conversion regions and the lower surface.

19. The image sensor of claim 16, further comprising a multi-layer insulating layer formed on the upper surface.

20. The image sensor of claim 16, wherein the partition layers comprise one body.

* * * * *